US008227880B2

(12) United States Patent
Tsujiuchi et al.

(10) Patent No.: US 8,227,880 B2
(45) Date of Patent: Jul. 24, 2012

(54) SEMICONDUCTOR DEVICE AND MANUFACTURING METHOD THEREOF

(75) Inventors: Mikio Tsujiuchi, Kanagawa (JP); Yosuke Takeuchi, Kanagawa (JP); Kazuyuki Omori, Kanagawa (JP); Kenichi Mori, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 192 days.

(21) Appl. No.: 12/874,894

(22) Filed: Sep. 2, 2010

(65) Prior Publication Data
US 2011/0057275 A1    Mar. 10, 2011

(30) Foreign Application Priority Data
Sep. 4, 2009   (JP) ................................. 2009-205036

(51) Int. Cl.
*H01L 29/82* (2006.01)

(52) U.S. Cl. ... 257/422; 257/421; 257/427; 257/E21.04; 257/E29.166; 438/3

(58) Field of Classification Search .................. 257/421, 257/422, 427, E21.04, E29.166; 438/3
See application file for complete search history.

(56) References Cited

U.S. PATENT DOCUMENTS
| | | | |
|---|---|---|---|
| 6,873,023 B2 | 3/2005 | Asao et al. | |
| 6,954,372 B2 | 10/2005 | Matsukawa et al. | |
| 6,992,342 B2 | 1/2006 | Motoyoshi et al. | |

FOREIGN PATENT DOCUMENTS
| | | |
|---|---|---|
| JP | 2003-318365 | 11/2003 |
| JP | 2004-031640 | 1/2004 |
| JP | 2004-040006 | 2/2004 |
| JP | 2005-340715 | 12/2005 |
| JP | 2006-310423 | 11/2006 |
| WO | WO 02/058166 | 7/2002 |

*Primary Examiner* — Tan N Tran
(74) *Attorney, Agent, or Firm* — McDermott Will & Emery LLP

(57) ABSTRACT

To provide a semiconductor device capable of write operation to a selected magnetoresistive element without causing a malfunction of a non-selected magnetoresistive element and a manufacturing method of this semiconductor device. The semiconductor device includes a magnetic storage element having a magnetization free layer whose magnetization direction is made variable and formed over a lead interconnect and a digit line located below the magnetic storage element, extending in a first direction, and capable of changing the magnetization state of the magnetization free layer by the magnetic field generated. The digit line includes an interconnect body portion and a cladding layer covering therewith the bottom surface and the side surface of the interconnect body portion and opened upward. The cladding layer includes a sidewall portion covering therewith the side surface of the interconnect body portion and a bottom wall portion covering therewith the bottom surface of the interconnect body portion. The thickness of the sidewall portion is made greater than that of the bottom wall portion.

13 Claims, 38 Drawing Sheets

SEMICONDUCTOR DEVICE AND MANUFACTURING METHOD THEREOF

CROSS-REFERENCE TO RELATED APPLICATIONS

The disclosure of Japanese Patent Application No. 2009-205036 filed on Sep. 4, 2009 including the specification, drawings and abstract is incorporated herein by reference in its entirety.

BACKGROUND OF THE INVENTION

The present invention relates to a semiconductor device and a manufacturing method thereof, in particular, to a semiconductor device equipped with a magnetic resistor and a manufacturing method of the device.

As one mode of semiconductor devices, there is an MRAM (magnetic random access memory) using a magnetoresistive element called MTJ (magnetic tunnel junction). In the MRAM, magnetoresistive elements are placed at positions where digit lines extending in one direction intersect with bit lines extending in a direction substantially perpendicular thereto and they are formed in an array form. Magnetoresistive elements each has two magnetic layers stacked one after another while having therebetween a tunnel insulating film.

In recent years, for reducing power consumption, the MRAM has adopted an interconnect structure including a cladding layer as a structure of digit lines and bit lines which causes a magnetic field to selectively act on the magnetoresistive element. The cladding layer has a function of shielding a magnetic field. In the digit line located below the magnetoresistive element, therefore, the cladding layer covers the side surfaces and the bottom surface of the digit line except the upper surface of the digit line located immediately below the magnetoresistive element. In the bit lines located above the magnetoresistive element, on the other hand, the cladding layer covers the side surfaces and the upper surface of the bit line except the bottom surface of the bit line immediately above the magnetoresistive element. There have conventionally been proposed various kinds of MRAMs using such a cladding layer.

For example, a magnetic memory device described in Japanese Patent Laid-Open No. 2004-40006 is equipped with a first interconnect, a second interconnect sterically intersecting with the first interconnect, and a tunnel magnetoresistive element which is electrically insulated from the first interconnect but is electrically coupled to the second interconnect and has, in a cross region of the first interconnect and the second interconnect, a tunnel insulating layer sandwiched between ferromagnetic bodies.

This magnetic memory device has a contact portion for coupling the tunnel magnetoresistive element to an interconnect layer and this contact portion couples an interconnect layer provided below the first interconnect to the tunnel magnetoresistive element and is formed in a coupling hole penetrating through the first interconnect.

The magnetic memory device has further a flux concentrator comprised of a high magnetic permeability film on both side surfaces of the first interconnect and on the surface of the first interconnect opposite to the surface facing to the tunnel magnetoresistive element.

Japanese Patent Laid-Open No. 2003-318365 describes a magnetic random access memory equipped with a TMR element and a write word line located immediately below the TMR element. The write word line is covered, at both side surfaces and the bottom surface thereof, with a yoke material having a high magnetic permeability.

International Patent Publication No. 2002-58166 describes a magnetic storage device having a magnetoresistive element, a conductor for generating a flux for causing a change in resistance of the magnetoresistive element, and a magnetic yoke having this conductor placed inside thereof.

Japanese Patent Laid-Open No. 2005-340715 describes a magnetic memory device having a memory portion comprised of a TMR element obtained by stacking a magnetization fixed layer, a tunnel barrier layer, and a magnetization free layer one after another. A write word line is placed opposite to the TMR element via an insulating layer. A high magnetic permeability layer is provided so that it reaches the side surface side of the TMR element from the bottom of the write word line.

Japanese Patent Laid-Open No. 2004-31640 describes a magnetic memory device equipped with a MOS transistor formed on a silicon substrate, an interlayer insulating film formed on the silicon substrate, and a plurality of TMR elements buried in the interlayer insulating film.

This magnetic memory device has a write bit line and a write word line placed so as to sandwich each TMR element therebetween and a yoke portion formed on the surfaces of the write bit line and the write word line except the surface facing the TMR element.

Japanese Patent Laid-Open No. 2006-310423 describes a magnetic memory equipped with a memory cell having a magnetoresistive element, a write interconnect through which a write current for generating a write magnetic field flows upon writing information to the memory cell, and a ferromagnetic film covering therewith at least a portion of the surfaces of the write interconnect except the surface facing the memory cell.

[Patent Documents]
[Patent Document 1] Japanese Patent Laid-Open No. 2004-40006
[Patent Document 2] Japanese Patent Laid-Open No. 2003-318365
[Patent Document 3] International Patent Publication No. 2002-58166
[Patent Document 4] Japanese Patent Laid-Open No. 2005-340715
[Patent Document 5] Japanese Patent Laid-Open No. 2004-31640
[Patent Document 6] Japanese Patent Laid-Open No. 2006-310423

SUMMARY OF THE INVENTION

In the conventional semiconductor devices, when a write operation or the like is performed on a selected magnetoresistive element, a current is supplied to a predetermined digit line and bit line, whereby a magnetic field acts on the selected magnetoresistive element.

Even if the side surfaces of the digit line are covered with a cladding layer, the magnetic field sometimes leaks from the side surfaces of the digit line, which however depends on the thickness of the side surfaces of the cladding layer.

The magnetic field leaking from the side surfaces of the digit line sometimes reaches a non-selected magnetoresistive element adjacent to the selected magnetoresistive element. Application of the magnetic field to the non-selected magnetoresistive element may cause malfunction of the non-selected magnetoresistive element.

With a view to overcoming the above-described problem, the invention has been made. An object of the present invention is to provide a semiconductor device capable of suppressing, during a write operation or the like to a selected magnetoresistive element, malfunction of a non-selected magnetoresistive element, and a manufacturing method of this semiconductor device.

In one mode of the invention, there is provided a semiconductor device having a semiconductor substrate, a switching element formed over a main surface of the semiconductor substrate, an interlayer insulating film covering therewith the switching element, a flat plate-like lead interconnect formed over the interlayer insulating film, a coupling interconnect for coupling the lead interconnect to the switching element, a magnetic storage element including a magnetization free layer whose magnetization direction is made variable and formed over the lead interconnect, a first interconnect located below the magnetic storage element, extending in a first direction, and capable of changing the magnetization state of the magnetization free layer by a magnetic field generated, and a second interconnect located above the magnetic storage element, extending in a second direction, and capable of changing the magnetization state of the magnetization free layer by a magnetic field generated. The magnetic storage element is provided on the upper surface of the lead interconnect but distant from the coupled position of the lead interconnect and the coupling interconnect. The first interconnect has a first interconnect body and a first magnetic field shielding layer which is provided so as to cover the bottom surface and side surfaces of the first interconnect body and is opened upward. The first magnetic field shielding layer has a first sidewall portion covering therewith the side surfaces of the first interconnect body and a first bottom wall portion covering therewith the bottom surface of the first interconnect body. The thickness of the first sidewall portion is greater than that of the first bottom wall portion.

In another mode of the invention, there is provided a semiconductor device having a semiconductor substrate, a switching element formed over a main surface of the semiconductor substrate, an interlayer insulating film covering therewith the switching element, a flat plate-like lead interconnect formed over the interlayer insulating film, a coupling interconnect for coupling the lead interconnect to the switching element, a magnetic storage element including a magnetization free layer whose magnetization direction is made variable and formed over the lead interconnect, a first interconnect located below the magnetic storage element, extending in a first direction, and capable of changing the magnetization state of the magnetization free layer by a magnetic field generated, and a second interconnect located above the magnetic storage element, extending in a second direction, and capable of changing the magnetization state of the magnetization free layer by a magnetic field generated. The magnetic storage element is provided at a position distant from the coupled position of the lead interconnect and the coupling interconnect. The first interconnect has a first interconnect body and a first magnetic field shielding layer covering the side surfaces of the first interconnect body. The first magnetic field shielding layer is opened upward and downward.

A manufacturing method of a semiconductor device comprising the following steps: preparing a semiconductor substrate having a main surface, forming a switching element over the main surface of the semiconductor substrate, forming an insulating film so as to cover therewith the switching element, forming a coupling interconnect coupled to the switching element and reaching the upper surface of the insulating film, forming a first interconnect trench in the insulating film, forming a first magnetic field shielding layer over the inner peripheral surface of the first interconnect trench, forming a first interconnect body over the first magnetic field shielding layer, forming a flat insulating film having a flat upper surface over the first interconnect body and the insulating film, forming a flat-plate like lead interconnect located over the flat insulating film and coupled to the coupling interconnect, and forming a magnetic storage element over the lead interconnect. The first magnetic field shielding layer includes a first bottom wall portion covering therewith the bottom surface of the first interconnect trench and a first sidewall portion covering the side surfaces of the first interconnect trench. The thickness of the first sidewall portion of the first magnetic field shielding layer is greater than that of the first bottom wall portion of the first magnetic field shielding layer.

The semiconductor device and the manufacturing method of a semiconductor device according to the invention make it possible to suppress occurrence of malfunction of a non-selected magnetoresistive element.

DETAILED DESCRIPTION OF THE PREFERRED EMBODIMENTS

Figure 53:
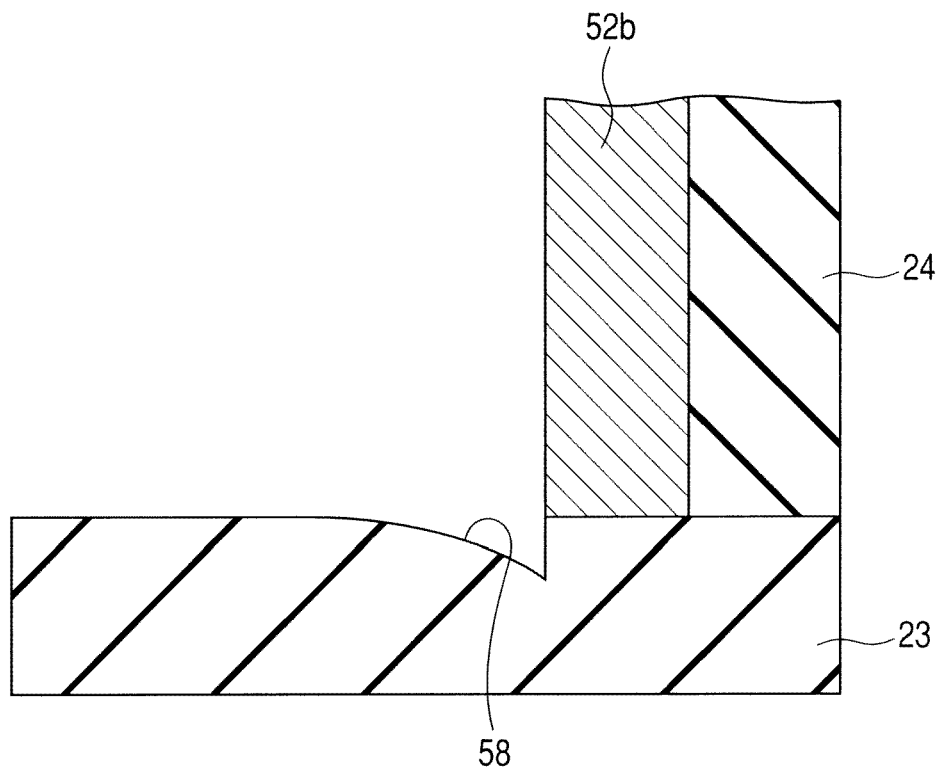
FIG. 53 is an enlarged cross-sectional view of a portion of the cladding layer 52.

The semiconductor device and the manufacturing method of a semiconductor device according to the invention will be described referring to FIGS. 1 to 53. In the following embodiment, when a reference is made to the number, amount, or the like, a range of the invention is not necessarily limited to the number, amount or the like unless otherwise specifically indicated. In addition, in the following embodiment, each configuring element is not always essential for the invention unless otherwise specifically indicated.

Figure 1:
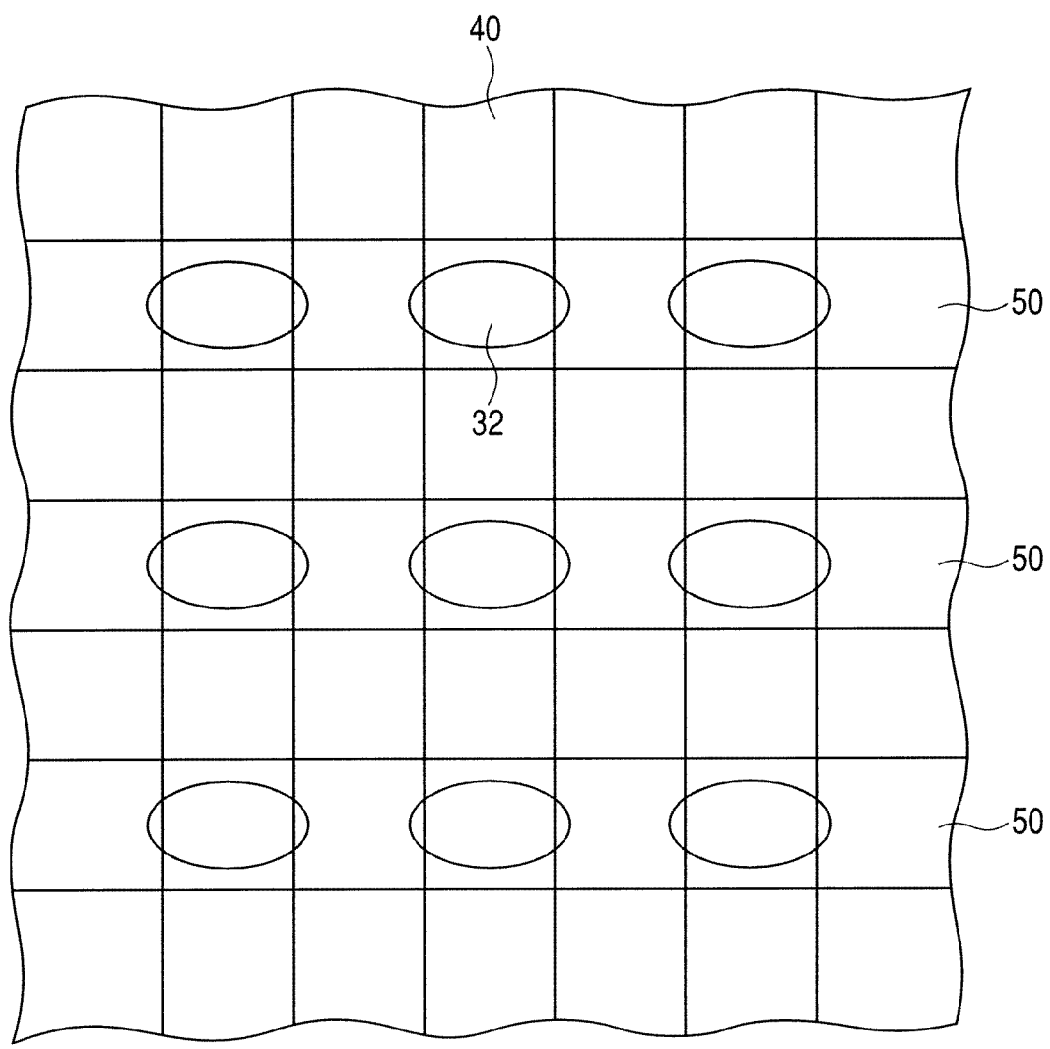
FIG. 1 is a plan view schematically illustrating a semiconductor device 200 according to the present embodiment.

FIG. 1 is a plan view schematically illustrating a semiconductor device 200 according to the present embodiment. As illustrated in FIG. 1, a semiconductor substrate 100 is equipped with a bit line 40 extending in one direction, and a digit line (first interconnect) 50 located above the bit line 40 and intersecting with the bit line (second interconnect) 40, and a magnetic storage element 32 located between the digit line 50 and the bit line 40 and formed in a region where the digit line 50 and the bit line 40 intersect with each other.

The bit line 40 extends in one direction. There is a plurality of the bit lines 40 formed with a space therebetween. The digit line 50 extends in an arrangement direction of the bit lines 40 and there is a plurality of the bit lines 40 formed with a space therebetween in an extending direction. The magnetic storage element 32 is located in each of intersecting portions of the digit lines 50 and the bit lines 40.

Figure 2:
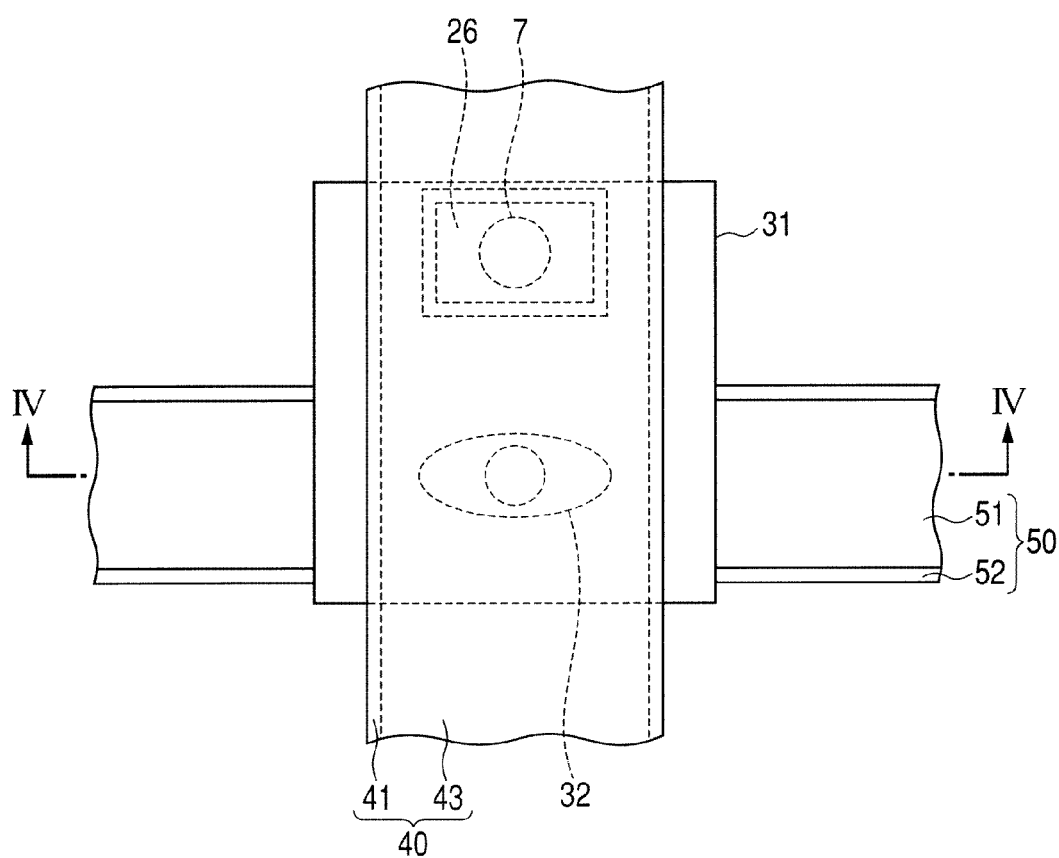
FIG. 2 is a plan view illustrating a magnetic storage element 32 and vicinity thereof.

FIG. 2 is a plan view illustrating the magnetic storage element 32 and vicinity thereof. As illustrated in FIG. 2, the magnetic storage element 32 is formed, in a planar view, inside of an intersecting region of the digit line 50 and the bit line 40.

Figure 3:
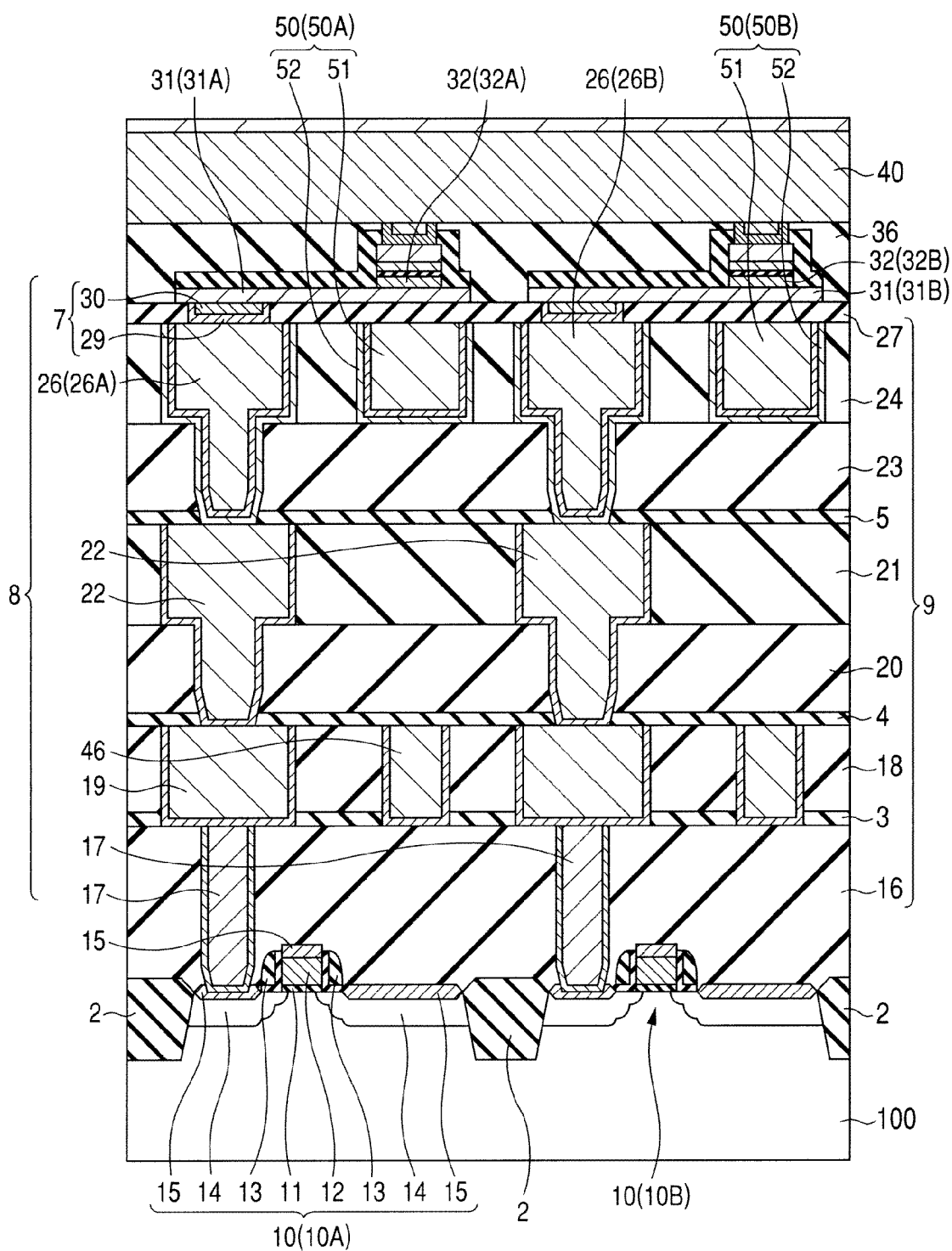
FIG. 3 is a cross-sectional view of the semiconductor device 200.

FIG. 3 is a cross-sectional view of the semiconductor device 200. The semiconductor device 200 is equipped with the semiconductor substrate 100, a plurality of MOS transistors (switching elements) 10 formed on the main surface of the semiconductor substrate 100, an interlayer insulating film 9 including a plurality of insulating films covering therewith the MOS transistors 10 and a flat insulating film 27 formed on the insulating film, and a lead interconnect (conductive film, lower electrode) 31 formed on the upper surface of the flat insulating film 27.

The semiconductor device 200 is equipped with a coupling interconnect 8 for coupling the MOS transistor 10 to the lead interconnect 31 and a magnetic storage element 32 formed on the upper surface of the lead interconnect 31.

As can be seen from this FIG. 3, a lead interconnect 31A and a lead interconnect 31B are provided with a space therebetween and the lead interconnect 31A has, on the upper surface thereof, a magnetic storage element 32A. The lead interconnect 31B has, on upper surface thereof, a magnetic storage element 32B.

The magnetic storage element 32A has therebelow a digit line (first interconnect) 50A, while the magnetic storage element 32B has therebelow a digit line 50B.

The magnetic storage element 32A and magnetic storage element 32B have thereabove the bit line 40.

A magnetic field is formed around the digit line 50A and the bit line 40 when a current flows through the digit line 50A and the bit line 40. A synthesized magnetic field of the magnetic field of the digit line 50A and the magnetic field of the bit line 40 is applied to the magnetic storage element 32A.

The semiconductor substrate 100 has, on the main surface thereof, an element isolation film 2 defining active regions. The MOS transistors 10 are formed on these active regions.

In the cross-section illustrated in FIG. 3, a MOS transistor 10A and a MOS transistor 10B are formed with a space therebetween.

The MOS transistor 10A is equipped with a channel region formed in the main surface of the semiconductor substrate 100, impurity regions 14 formed on both sides of this channel region, a gate insulating film 11, and a gate electrode 12 formed on the gate insulating film 11. The MOS transistor 10A includes sidewalls 13 formed on the side surfaces of the gate electrode 12, a metal film 15 formed on the upper surface of the impurity regions 14, and a metal film 15 formed on the gate electrode.

The coupling interconnect 8 is coupled to the impurity region 14 serving as a drain electrode and the other impurity region 14 functions as a source electrode.

The impurity region 14 serving as a source electrode is coupled to a contact portion not illustrated and coupled to a source interconnect 46 formed in the interlayer insulating film 9. The MOS transistor 10B is formed similarly to the MOS transistor 10A.

Figure 4:
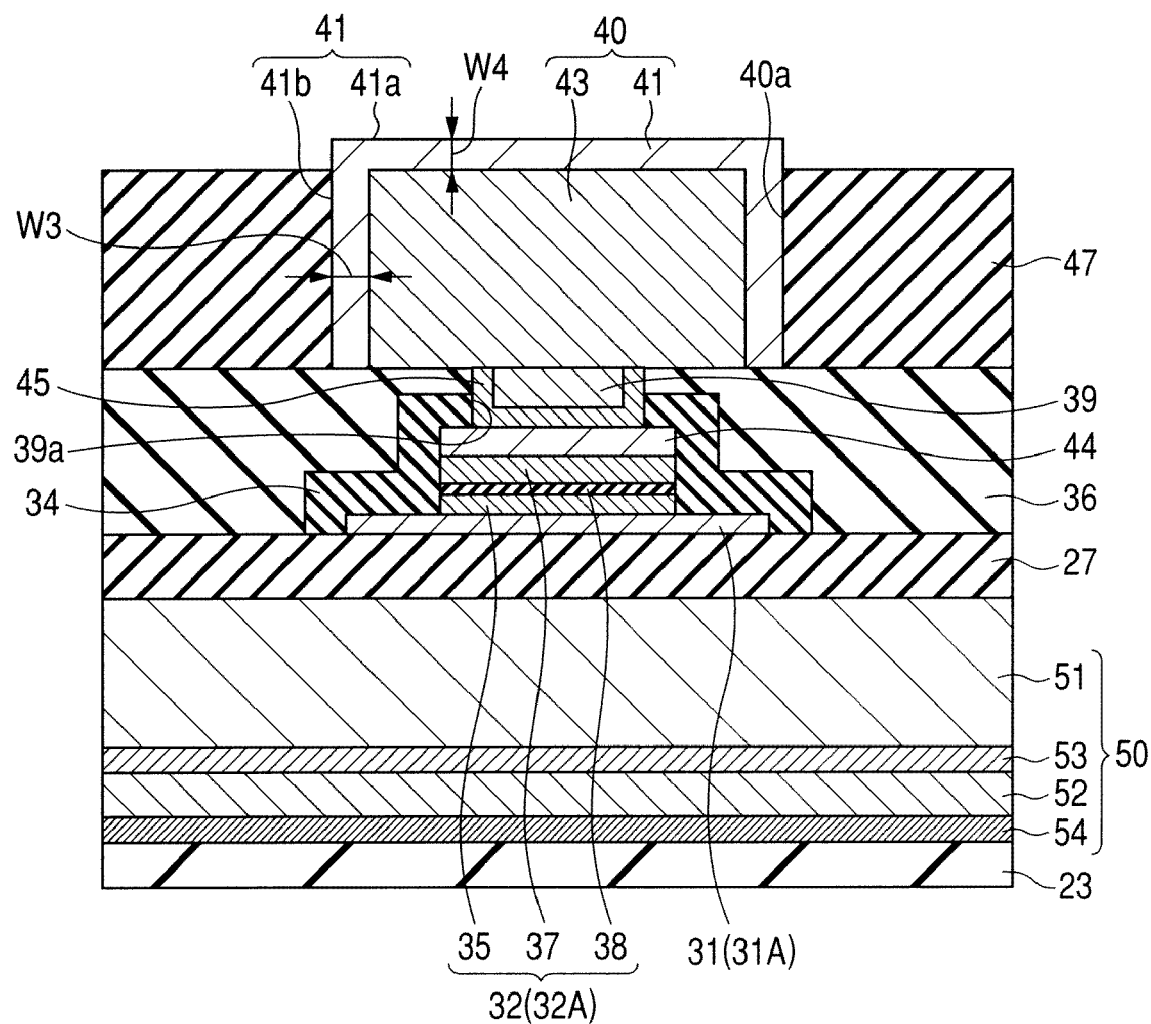
FIG. 4 is a cross-sectional view illustrating the configuration of the magnetic storage element 32A and vicinity thereof.

FIG. 4 is a cross-sectional view illustrating the configuration of the magnetic storage element 32A and the vicinity thereof. As illustrated in FIG. 4, the magnetic storage element 32A is formed on the lead interconnect 31A and is equipped with a magnetization fixed layer 35 coupled to the lead interconnect 31A, a tunnel insulating film 38 formed on this magnetization fixed layer 35, and a magnetization free layer 37 formed on the tunnel insulating film 38.

In the magnetization free layer 37, a magnetization direction is variable along with the action of the magnetic field. In the magnetization fixed layer 35, a magnetization direction is fixed and even when a magnetic field is applied from the environment, the magnetization direction is kept constant.

The magnetic storage element 32 is coupled to the MOS transistors 10 with the lead interconnect 31 and the coupling interconnect 8 as illustrated in FIG. 3.

The magnetic storage element 32A has, on the upper surface thereof, a metal film (conductive film, upper electrode) 44 and this metal film 44 has, on the upper surface thereof, a contact portion 39 coupled to the bit line 40. Thus, the magnetization free layer 37 of the magnetic storage element 32A is coupled to the bit line 40.

Upon rewriting electrical information of the selected magnetic storage element 32, a current is caused to flow through the digit line 50 located below the selected magnetic storage element 32 and the bit line 40 located above the selected magnetic storage element 32.

When a current flows through the digit line 50 and the bit line 40, there occurs a magnetic field around the digit line 50 and the bit line 40.

The magnetic field generated by a current flowing through the digit line 50 and the magnetic field generated by a current flowing through the bit line 40 are synthesized and act on the selected magnetic storage element 32.

When the magnetic field acts on the selected magnetic storage element 32, the magnetization direction of the magnetization free layer 37 of the selected magnetic storage element 32 is changed.

More specifically, the magnetization direction of the magnetization free layer 37 sometimes coincides with the magnetization direction of the magnetization fixed layer 35 and sometimes becomes opposite to that of the magnetization fixed layer 35. The electrical resistance of the magnetic storage element 32 differs between when the magnetization direction of the magnetization free layer 37 coincides with that of the magnetization fixed layer 35 and when the magnetization direction of the magnetization free layer 37 is contrary to that of the magnetization fixed layer 35. This difference in electrical resistance is utilized as information corresponding to "0" or "1".

When reading out the information from the selected magnetic storage element 32, the MOS transistor 10 coupled to the selected magnetic storage element 32 is turned ON.

When a voltage is applied to pass through the MOS transistor 10 and the bit line 40, the resistance of the selected magnetic storage element 32 is detected and electrical information stored in the magnetic storage element 32 can be read out.

The magnetic storage element 32 is formed on the lead interconnect 31 and the lead interconnect 31 is formed on the flat insulating film 27 having a flat surface. The lead interconnect 31 is therefore formed in a flat plate form and has a flat upper surface.

The magnetic storage element 32 is formed on the upper surface of the lead interconnect 31 away from a coupled position of the lead interconnect 31 and the coupling interconnect 8. In the manufacturing procedure of the semiconductor device 200, formation of the lead interconnect 31 on the upper end portion of the coupling interconnect 8 is likely to cause irregularities at the coupled portion of the lead interconnect 31 to the coupling interconnect 8.

It is therefore possible to ensure surface flatness of the lead interconnect 31 located below the magnetic storage element 32 by providing a space between the coupled portion of the coupling interconnect 8 and the lead interconnect 31 and the magnetic storage element 32.

Since the magnetic storage element 32 is formed on the upper surface of the lead interconnect 31 whose surface flatness has been ensured, the surface flatness of each of the magnetization fixed layer 35, the tunnel insulating film 38, and the magnetization free layer 37 of the magnetic storage element 32 can be ensured.

Supposing that irregularities are formed on the interface between the magnetization fixed layer 35 and the tunnel insulating film 38 or the tunnel insulating film 38 and the magnetization free layer 37, magnetic poles are likely to appear at the top of the irregularities of the magnetization fixed layer 35 and the magnetization free layer 37.

Appearance of magnetic poles at the magnetization fixed layer 35 and the magnetization free layer 37 causes interlayer linkage between the magnetization fixed layer 35 and the magnetization free layer 37. The magnetic moment of the magnetization free layer 37 is drawn by the magnetization fixed layer 35, preventing a free change of the magnetization direction of the magnetization free layer 37. As a result, write failures or readout failures of the magnetic storage element 32 are likely to occur.

In the semiconductor device 200 according to the present embodiment, the surface flatness of the magnetization fixed layer 35, the tunnel insulating film 38, and the magnetization free layer 37 can be ensured as described above, making it possible to improve the readout performance and write performance.

The magnetization fixed layer 35 and the magnetization free layer 37 are made of, for example, a ferromagnetic material composed mainly of nickel, iron, and/or cobalt. In order to improve the magnetic property of the ferromagnetic material and impart it with thermal stability, an additive such as boron, nitrogen, silicon or molybdenum may be introduced into the ferromagnetic material. As the magnetization fixed layer and the magnetization free layer, substances such as NiMnSb, $Co_2Mn(Ge,Si)$, $Co_2Fe(Al,Si)$, and $(Zn,Mn)Fe_2O_4$ which are called "half metal" may be used. A half metal has an energy gap in one of its spin bands so that it can provide a very large magnetic effect. As a result, a large signal output can be obtained. As one example of combinations of the magnetization fixed layer and the magnetization free layer, a stack structure of a platinum manganese alloy film and a cobalt iron alloy film may be used as the magnetization fixed layer and a nickel iron alloy film may be used as the magnetization free layer.

The lead interconnect 31 extends in an extending direction of the bit line 40, the digit line 50 is located on the side of one end portion of the lead interconnect 31, and the coupling interconnect 8 is located on the side of the other end portion of the lead interconnect 31. The digit line 50 and the coupling interconnect 8 are provided with a space therebetween.

Figure 5:
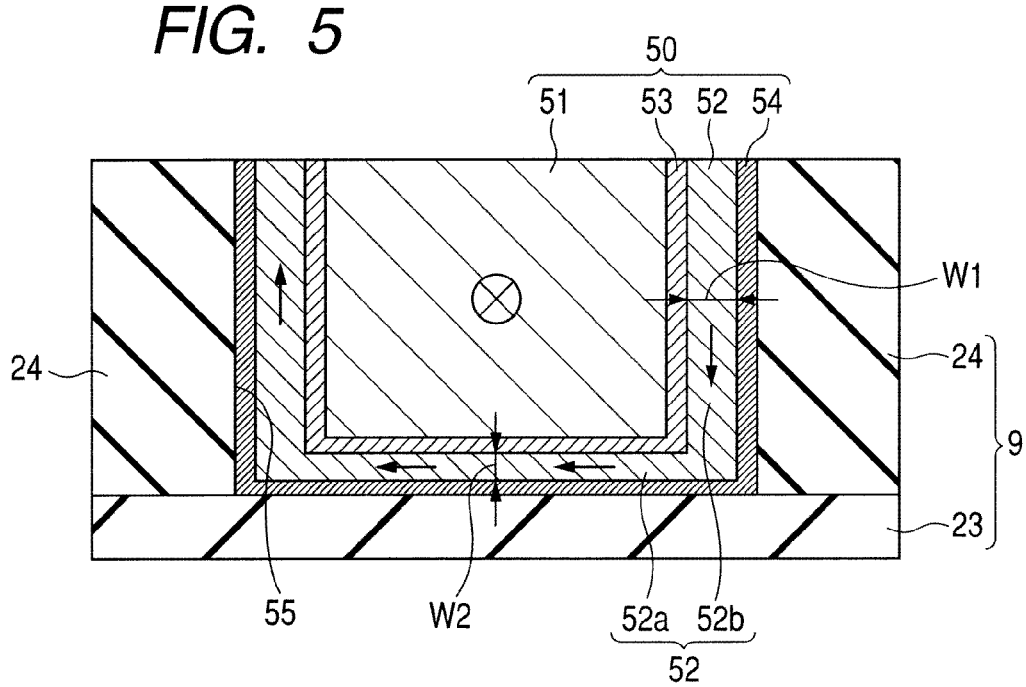
FIG. 5 is a cross-sectional view illustrating details of a digit line 50.

FIG. 5 is a cross-sectional view illustrating the details of the digit line 50. In the example illustrated in FIG. 5, the digit line 50 is formed in a digit line trench 55 formed in the interlayer insulating film 9. The digit line (first interconnect) 50 includes a barrier metal 54 extending along the inner peripheral surface of the interlayer insulating film 9, a cladding layer (first magnetic field shielding layer) 52 extending along the inner peripheral surface of the barrier metal 54, a barrier metal 53 extending along the inner peripheral surface of the cladding layer 52, and an interconnect body portion 51 formed on the barrier metal 53.

The cladding layer 52 is made of a high magnetic permeability material, for example, an alloy containing any one of nickel (Ni), iron (Fe), or cobalt (Co) or an amorphous alloy such as NiFe alloy (permalloy). The barrier metal 53 and the barrier metal 54 are made of the same material, for example, tantalum (Ta). The interconnect body portion 51 is made of, for example, a metal material such as copper.

The cladding layer 52 includes a bottom wall portion (first bottom wall portion) 52a covering therewith the bottom surface of the interconnect body portion 51 and a sidewall portion (first sidewall portion) 52b covering therewith the side surface of the interconnect body portion (first interconnect body portion) 51. The cladding layer 52 is opened upward. The cladding layer 52 is opened toward the magnetic storage element 32 as illustrated in FIG. 3 or the like. In the example illustrated in FIG. 5, the bottom wall portion 52a and the sidewall portion 52b are coupled to each other and the cladding layer 52 is in recessed form.

When a voltage is applied to the digit line 50, a current flows mainly in the interconnect body portion 51. When a current flows through the interconnect body portion 51, a magnetic flux is generated around the interconnect body portion 51 (right screw law). The cladding layer 52 is made of a magnetic material and the magnetic flux generated around the interconnect body portion 51 flows inside of the cladding layer.

For example, as illustrated in FIG. 5, when a current flows in the interconnect body portion 51 along a direction from the surface side to the reverse side of this paper, a magnetic flux flows clockwise in the cladding layer 52 and emitted upward. Since the cladding layer 52 is not formed on the upper surface of the interconnect body portion 51, the magnetic flux is emitted upward from the upper surface of the interconnect body portion 51.

Such a magnetic flux generated around the interconnect body portion 51 is emitted to the magnetic storage element 32 lying above the digit line 50. The density of the magnetic flux emitted to the magnetic storage element 32 can be increased in such a manner so that the magnetic field acting on the magnetic storage element 32 can be enhanced and a write operation to the magnetic storage element 32 can be performed correctly.

As illustrated in FIG. 5, the thickness W1 of the sidewall portion 52b of the cladding layer 52 is greater than a thickness W2 of the bottom wall portion 52a.

The amount of the magnetic flux leaked outside from the sidewall portion 52b therefore becomes smaller than that leaked outside from the bottom wall portion 52a.

In FIG. 3, for example, upon writing to the magnetic storage element 32A, a current flows through the digit line 50A lying below the magnetic storage element 32A. As described above, leakage of the magnetic flux from the side surfaces of the digit line 50A can be prevented so that it is possible to prevent a magnetic field generated by the digit line 50A from acting on a magnetic storage element 32B adjacent to the magnetic storage element 32A. This makes it possible to prevent the write operation to be performed to the non-selected magnetic storage element 32B incorrectly.

In FIG. 5, by making the thickness of the bottom wall portion 52a smaller than that of the sidewall portion 52b, a decrease in the cross-sectional area of the interconnect body portion 51 can be prevented and an increase in the resistance of the interconnect body portion 51 can therefore be prevented.

The barrier metal 53 prevents the reaction between the interconnect body portion 51 and the cladding layer 52 or diffusion of copper from the interconnect body portion 51 into the cladding layer 52.

The barrier metal 54 prevents diffusion of an element in the cladding layer 52 into the interlayer insulating film 9. The barrier metal 54 and the barrier metal 53 are not essential constituents and both the barrier metal 54 and the barrier metal 53 may be omitted. Alternatively, one of the barrier metal 54 and the barrier metal 53 may be omitted.

In FIG. 4, an insulating film 34 covering the magnetic storage element 32, an upper insulating film 36 covering the insulating film 34, and an upper insulating film 47 are formed. A contact hole 39a is formed in the upper insulating film 36, while a bit line 40 communicated with the contact hole 39a is formed in the upper insulating film 47.

The bit line 40 is equipped with a cladding layer (second magnetic field shielding layer) 41 and an interconnect body portion (second interconnect body portion) 43.

The cladding layer 41 is opened toward the magnetic storage element 32 and is equipped with a sidewall portion (second sidewall portion) 41b covering therewith both side surfaces of a bit line trench 40a and an upper wall portion 41a formed between the upper end portions of the sidewall portion 41b. The upper wall portion 41a is formed on the upper surface of the interconnect body portion 43.

The cladding layer 41 covers the side surfaces and the upper surface of the interconnect body portion 43 and is opened toward the magnetic storage element 32. When a current flows through the interconnect body portion 43, a magnetic field generated around the interconnect body portion 43 is emitted to the magnetic storage element 32.

The thickness W3 of the sidewall portion 41b is made greater than the thickness W4 of the upper wall portion 41a. This makes it possible to prevent the lateral leakage of the magnetic flux (magnetic field) generated around the interconnect body portion 43, and thereby preventing malfunction of a non-selected magnetic storage element 32 adjacent to the selected magnetic storage element.

The contact portion 39 for coupling the bit line 40 to the metal film 44 is equipped with a barrier metal 45 covering the inner surface of the contact hole 39a formed in the upper insulating film 36 and a contact body portion formed in the barrier metal 45.

In FIG. 3, the coupling interconnect 8 is equipped with a plurality of unit contact portions 17, 19, 22, and 26 and a coupling portion 7.

The unit contact portion 17 is coupled, at the lower end portion thereof, to the metal film 15 of the MOS transistors 10 and the unit contact portion 17 is coupled, at the upper end portion thereof, to an interconnect 19. The unit contact portion 22 is coupled, at the lower end portion thereof, to the interconnect 19 and the unit contact portion 22 is coupled, at the upper end portion thereof, to the unit contact portion 26. The unit contact portion 26 is coupled, at the upper end portion thereof, to the coupling portion 7 and the coupling portion 7 is coupled to the lead interconnect 31.

Among the plural unit contact portions 17, 22, and 26, the unit contact portion (upper unit coupling portion) 26 lying at the uppermost end potion and coupled to the coupling portion 7 includes a cladding layer. The unit contact portion 26 is formed immediately below the flat insulating film 27. The digit line 50 is also located immediately below the flat insulating film 27 and the digit line 50 and the unit contact portion 26 are provided with a space therebetween in the main surface direction of the semiconductor substrate 100.

Figure 6:
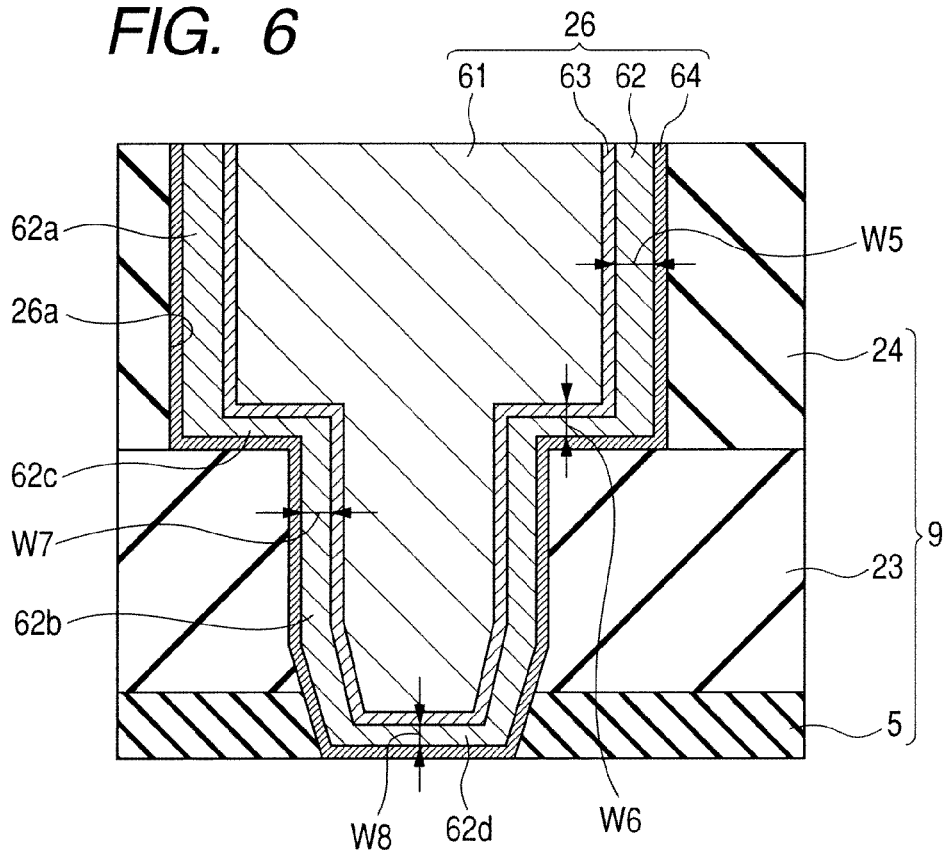
FIG. 6 is a cross-sectional view of a unit contact portion 26.

FIG. 6 is a cross-sectional view of the unit contact portion 26. As illustrated in FIG. 6, the unit contact portion 26 is formed in a contact hole 26a formed in the interlayer insulating film 9.

The unit contact portion 26 includes a barrier metal 64 formed on the inner peripheral surface of the contact hole 26a, a cladding layer (third magnetic field shielding layer) 62 formed on the inner peripheral surface of the barrier metal 64, a barrier metal film 63 formed on the cladding layer 62, and a contact body portion (coupling body portion) 61 formed on the barrier metal film 63.

The contact hole 26a extends over insulating films 5, 23, and 24. The contact hole 26a is comprised of a hole portion formed in the insulating layer 24, a hole portion formed in the insulating layer 23, and a hole portion formed in the insulating film 5. The hole portion formed in the insulating layer 23 has a smaller diameter than the hole portion formed in the insulating layer 24. A portion of the upper surface of the insulating layer 23 is therefore exposed in the contact hole 26a.

The cladding layer 62 includes a sidewall portion (third sidewall portion) 62a covering therewith the inner side surface of the insulating layer 24, a bottom wall portion (second bottom wall portion) 62c covering therewith the upper surface of the exposed insulating layer 23, a sidewall portion (third sidewall portion) 62b covering therewith the inner side surfaces of the insulating layer 23 and the insulating layer 5, and a bottom wall portion (second bottom wall portion) 62d. The barrier metal 64 covers therewith the outer peripheral surface of the cladding layer 62 and the barrier metal film 63 covers therewith the inner peripheral surface of the cladding layer 62.

A thickness W5 of the sidewall portion 62a and a thickness W7 of the sidewall portion 62b are greater than a thickness W6 of the bottom wall portion 62c and a thickness W8 of the bottom wall portion 62d.

Even if a current flows through the contact body portion 61 upon readout operation, leakage of a magnetic flux (magnetic field) to the sides of the unit contact portion 26 can be suppressed. This makes possible to suppress a malfunction of the non-selected magnetic storage element 32.

The semiconductor device 200 according to the present embodiment can thus suppress a malfunction of the magnetic storage element 32 even when a current flows in the bit line or digit line upon write operation or readout operation.

Figure 7:
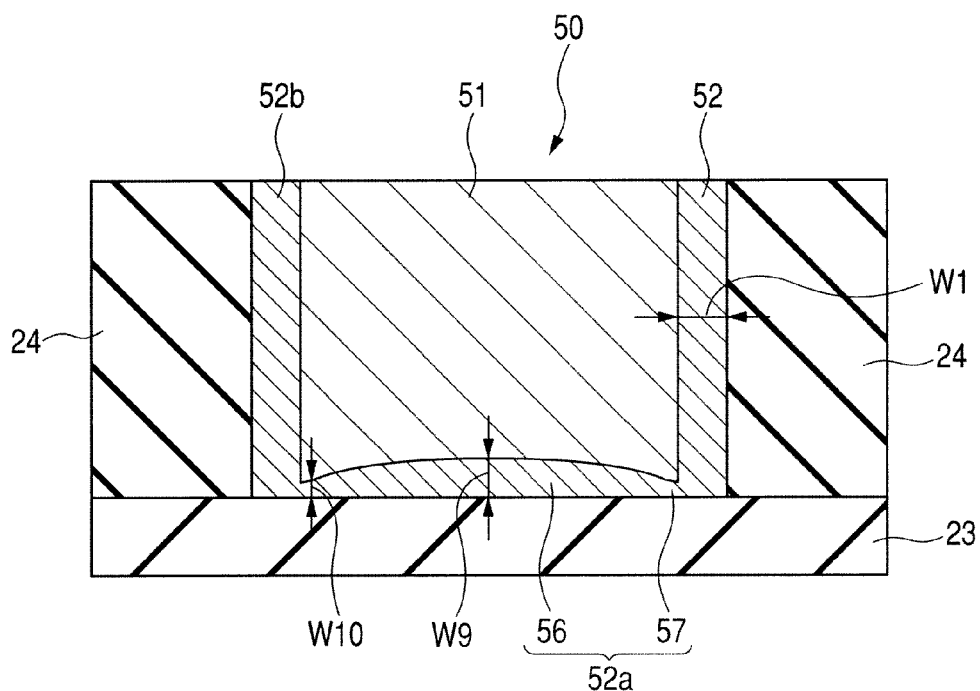
FIG. 7 is a cross-sectional view illustrating a first modification example of the digit line 50.

FIG. 7 is a cross-sectional view illustrating a first modification example of the digit line 50. The barrier metals 53 and 54 are omitted from this FIG. 7.

In the example illustrated in FIG. 7, the bottom wall portion 52a of the cladding layer 52 includes a thick film portion 56 and a thin film portion 57.

A thickness W9 of the thick film portion 56 is greater than a thickness W10 of the thin film portion 57. The thickness W9 of the thick film portion 56 is smaller than the thickness W1 of the sidewall portion 52b.

By forming the thin film portion 57 in the bottom wall portion 52a, the cross-sectional area of the interconnect body portion 51 can be increased and the electrical resistance of the interconnect body portion 51 can be reduced. The thick film portion 56 is formed at the center in the width direction of the bottom wall portion 52a and the thin film portion 57 is formed on both sides of the thick film portion 56. The thin film portion 57 is coupled to the sidewall portion 52b.

Figure 8:
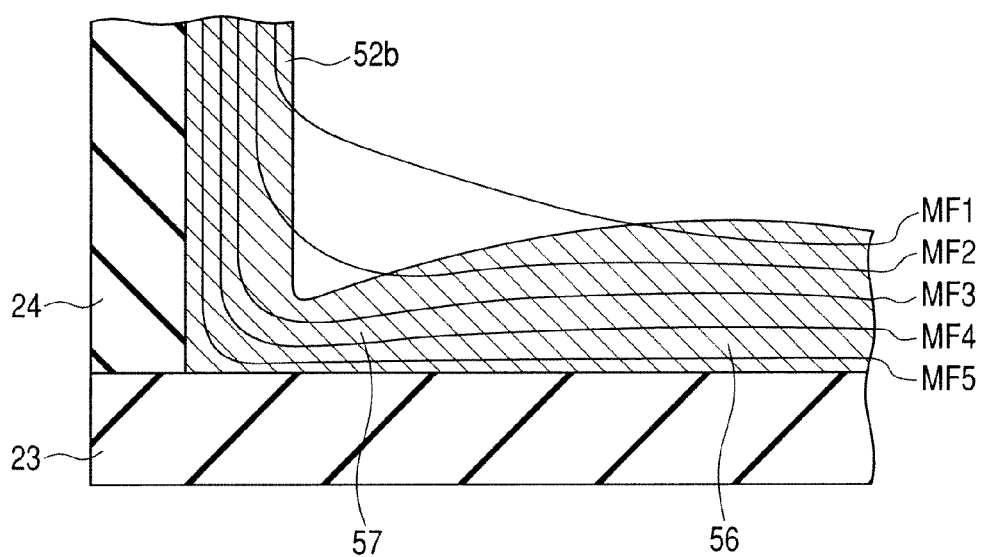
FIG. 8 is a cross-sectional view illustrating a coupled portion of a sidewall portion 52b and a thick film portion 56 and vicinity of the coupled portion.

FIG. 8 is a cross-sectional view illustrating a coupled portion of the sidewall portion 52b and the thick film portion 56 and vicinity of the coupled portion. In FIG. 8, the interconnect body portion 51 is not illustrated.

When a current flows in the interconnect body portion 51 from the reverse side to the surface side of this paper, magnetic field lines MF1 to MF5 flow in the cladding layer 52 as illustrated in FIG. 8.

Since the coupled portion of the thin film portion 57 and the sidewall portion 52b is thin, there may occur leakage of a magnetic flux entering from the sidewall portion 52b to the thick film portion 56.

In the example illustrated in FIG. 8, the magnetic field lines MF1 and MF2, of the magnetic lines MF1 to MF5 flowing in the sidewall portion 52b, leak from the sidewall portion 52b.

The thick film portion 56 has a great thickness so that a magnetic field line which has leaked from the sidewall portion 52b easily enters the thick film portion 56 again. The thick portion 56 becomes thicker with an increase in the distance from the coupled portion of the sidewall portion 52b and the thin film portion 57 and at the same time, it is formed at the center in the width direction of the digit line 50. Even if a magnetic flux leaks from a portion of the sidewall portion 52b distant from the coupled portion of the thin film portion 57 and the sidewall portion 52b, the leaked magnetic flux easily enters the thick film 56.

Figure 9:
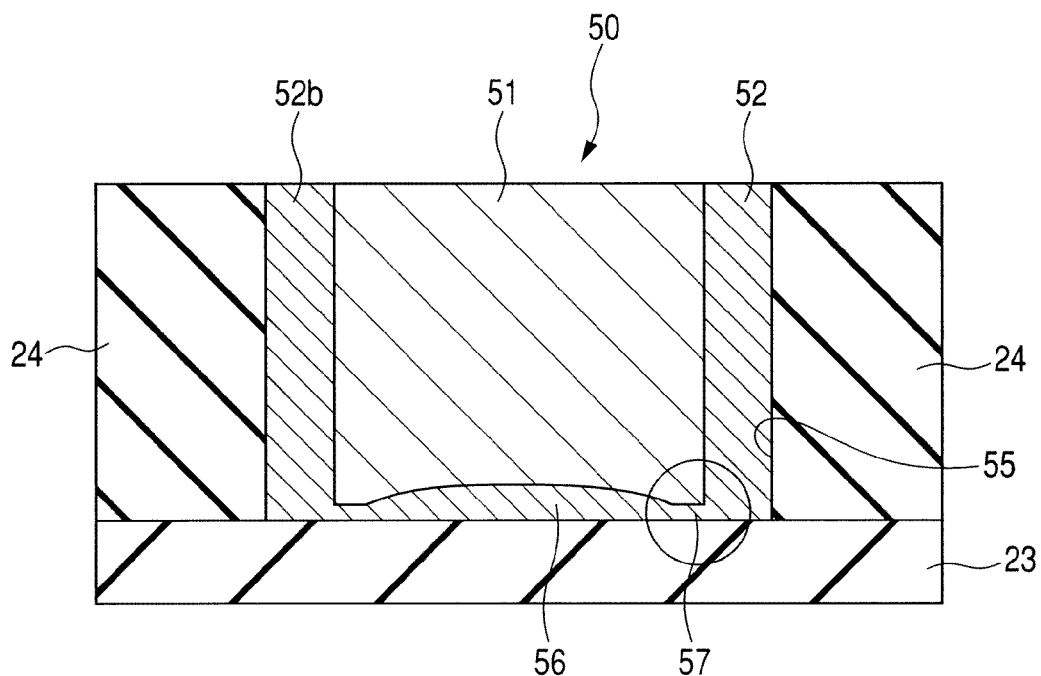
FIG. 9 is a cross-sectional view illustrating a second modification example of the digit line 50.
Figure 10:
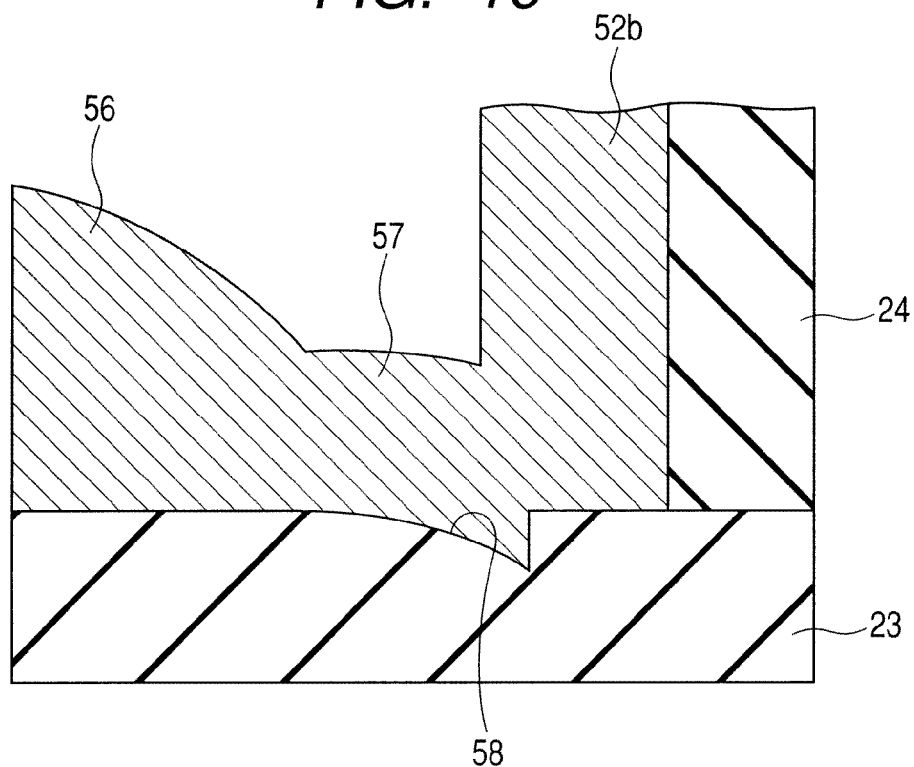
FIG. 10 is a cross-sectional view illustrating a coupled portion of a thin film portion 57 and the sidewall portion 52b and vicinity of the coupled portion.

FIG. 9 is a cross-sectional view illustrating a second modification example of the digit line 50. FIG. 10 is a cross-sectional view illustrating a coupled portion of the thin film portion 57 and the sidewall portion 52b and vicinity of the coupled portion.

In the example illustrated in FIG. 10, at a portion of the surface of the insulating layer 23 located below the thin film portion 57, a recess 58 is formed. A portion of the thin film portion 57 enters the recess 58. Since the thin film portion 57 enters the recess 58, a wide cross-sectional area of the interconnect body portion 51 can be ensured.

Figure 11:
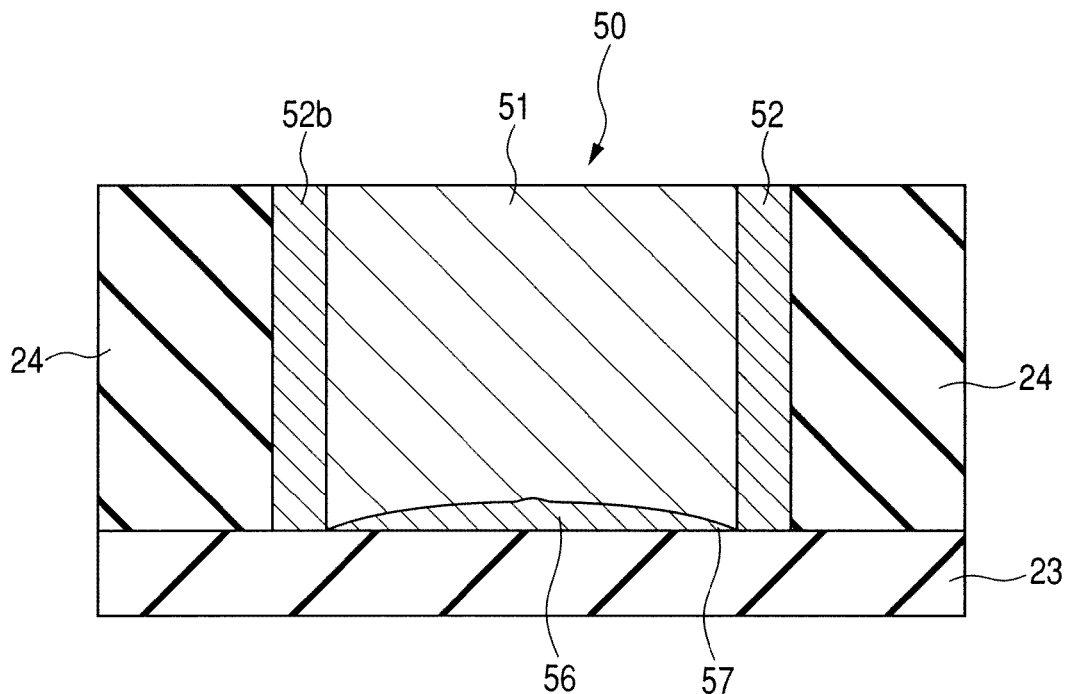
FIG. 11 is a cross-sectional view illustrating a third modification example of the digit line 50.

FIG. 11 is a cross-sectional view illustrating a third modification example of the digit line 50. As illustrated in FIG. 11, the thickness of the end portions of the thin film portion 57 may be decreased considerably.

Figure 12:
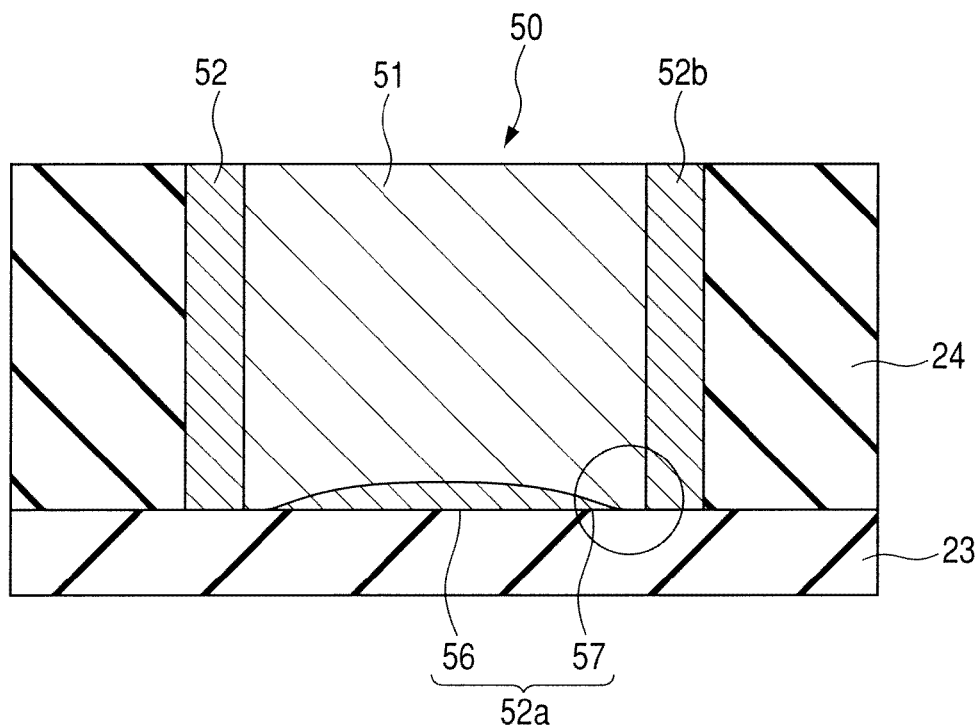
FIG. 12 is a cross-sectional view illustrating a fourth modification example of the digit line 50.
Figure 13:
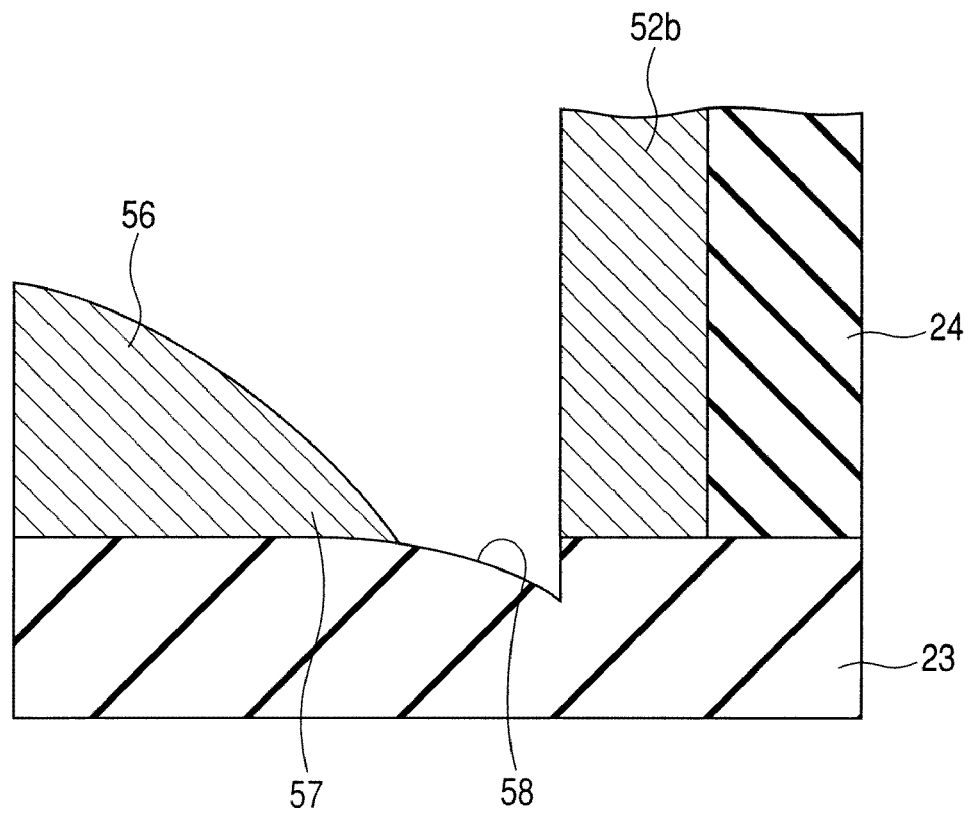
FIG. 13 is a cross-sectional view illustrating a coupled portion of the sidewall portion 52b and the thin film portion 57 in the digit line 50 and vicinity of the coupled portion.

FIG. 12 is a cross-sectional view illustrating a fourth modification example of the digit line 50. FIG. 13 is a cross-sectional view illustrating a coupled portion of the sidewall portion 52b and the thin film portion 57 of the digit line 50 as illustrated in FIG. 13 and vicinity of the coupled portion.

As illustrated in FIG. 12, there is a space between the bottom wall portion 52a and the sidewall portion 52b. As illustrated in FIG. 13, there is a space between the thin film portion 57 located at the end portion in the width direction of the bottom wall portion 52a and the sidewall portion 52b.

A recess 58 is formed at a portion of the upper surface of the insulating layer 23 between the thin film portion 57 and the sidewall portion 52b. The interconnect body portion 51 enters the recess 58, which increases the cross-sectional area of the interconnect body portion 51. This leads to a reduction in the electrical resistance of the interconnect body portion 51.

Figure 14:
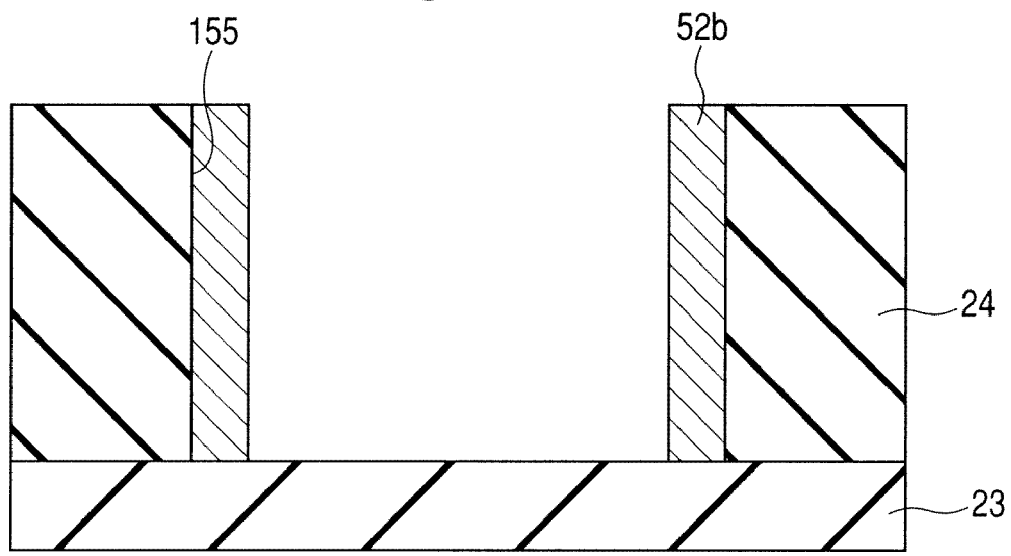
FIG. 14 is a cross-sectional view illustrating a fifth modification example of the digit line 50.

FIG. 14 is a cross-sectional view illustrating a fifth modification example of the digit line 50. As illustrated in FIG. 14, the bottom portion of the digit line trench 55 is exposed from the cladding layer 52. In the example illustrated in FIG. 14, the cladding layer 52 is equipped with the sidewall portion 52b covering the inner side surface of the digit line trench 55 and the cladding layer 52 is opened upward and downward.

In the example illustrated in FIG. 14, the cladding layer 52 is not equipped with the bottom wall portion 52a so that the cross-sectional area of the interconnect body portion 51 can be increased. Further, also in the cladding layer 52 as illustrated in FIG. 14, the interconnect body portion 51 has, on the side surface thereof, the sidewall portion 52b so that it is possible to prevent a magnetic field from acting on another magnetic storage element 32 adjacent to the selected magnetic storage element 32.

Referring to FIGS. 15 to 38, a manufacturing method of the semiconductor device 200 according to the present embodiment will next be described.

Figure 15:
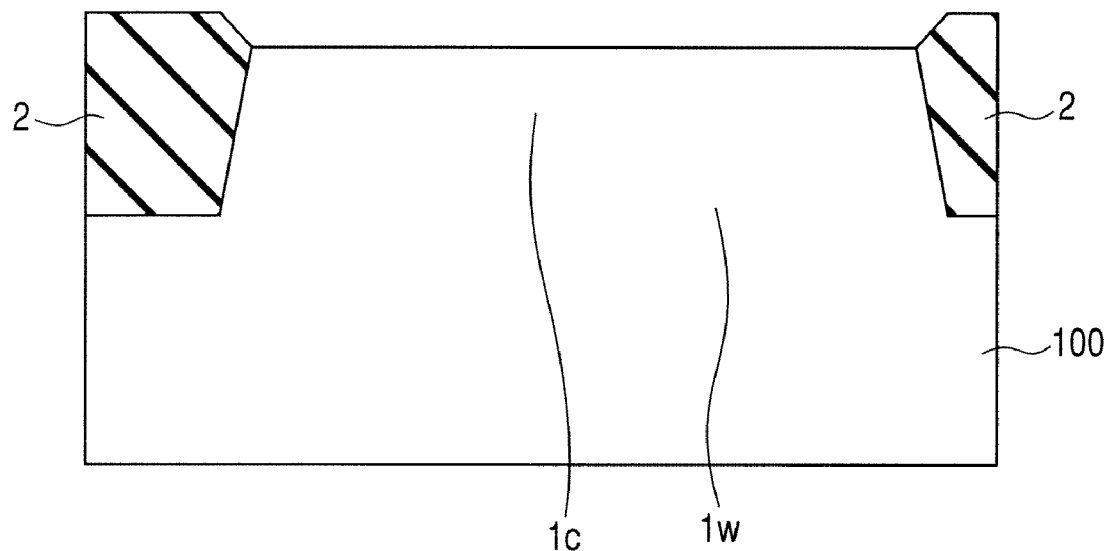
FIG. 15 is a cross-sectional view illustrating a first manufacturing step of manufacturing steps of the semiconductor device 200.

As illustrated in FIG. 15, a semiconductor substrate 100 having a main surface is prepared. Isolation insulating films 2 are formed on the main surface of the semiconductor substrate 100. An active region is formed on the main surface of the semiconductor substrate 100, defined by the isolation insulating films 2.

An impurity is introduced into the active region by ion implantation or the like method to successively form a well region 1w and a channel region 1c.

Figure 16:
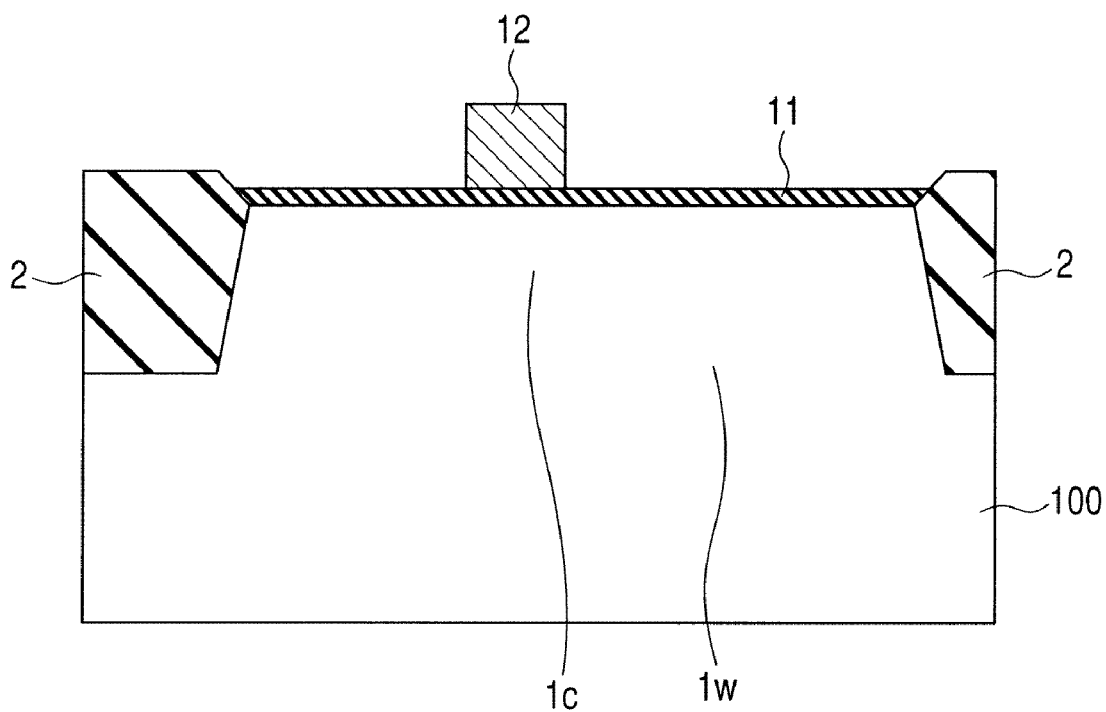
FIG. 16 is a cross-sectional view illustrating a manufacturing step after that illustrated in FIG. 15.

As illustrated in FIG. 16, a thermal oxidation treatment is performed to form a gate insulating film 11 on the main surface of the channel region 1c. Then, a polycrystalline silicon film or the like is deposited and the resulting polycrystalline silicon film or the like is patterned to form a gate electrode 12 on the gate insulating film 11.

Figure 17:
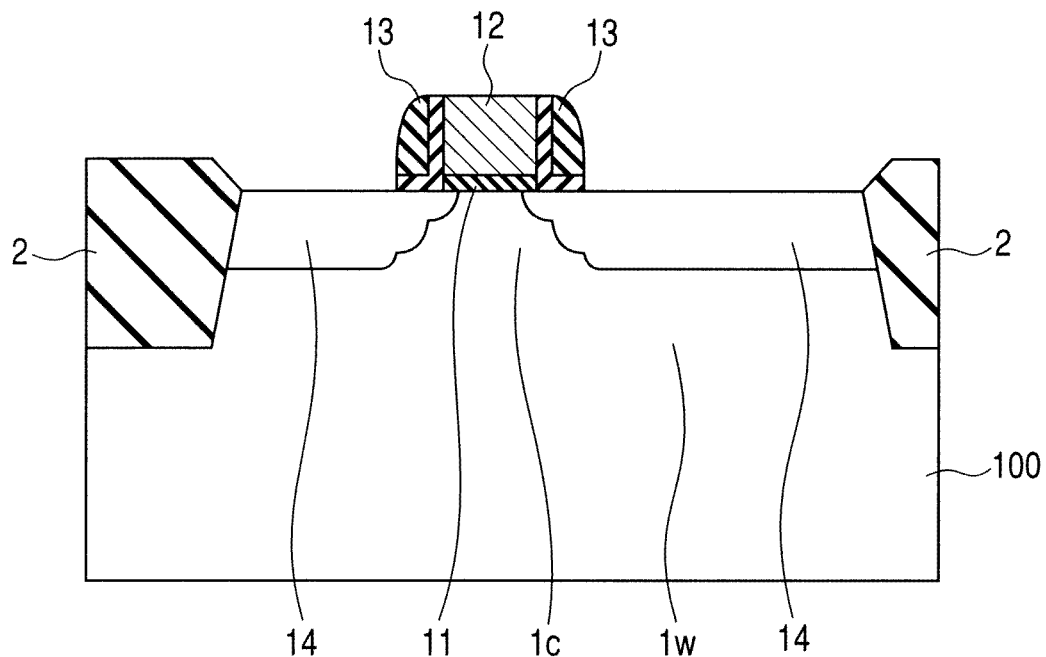
FIG. 17 is a cross-sectional view illustrating a manufacturing step after that illustrated in FIG. 16.

Then, as illustrated in FIG. 17, with the gate electrode 12 as a mask, an impurity having a predetermined conductivity type is introduced into the active region 1. An insulating film such as silicon oxide film is formed on the side surface of the gate electrode 12. After formation of this insulating film, an impurity is introduced into the active region 1 again.

After the second time introduction of an impurity, an insulating film such as silicon oxide film or silicon nitride film is deposited. The insulating film thus deposited is dry etched to form a sidewall 13. After formation of the sidewall 13, an impurity is introduced into the channel region 1c again, whereby an impurity region 14 functioning as a source or a drain is formed.

Figure 18:
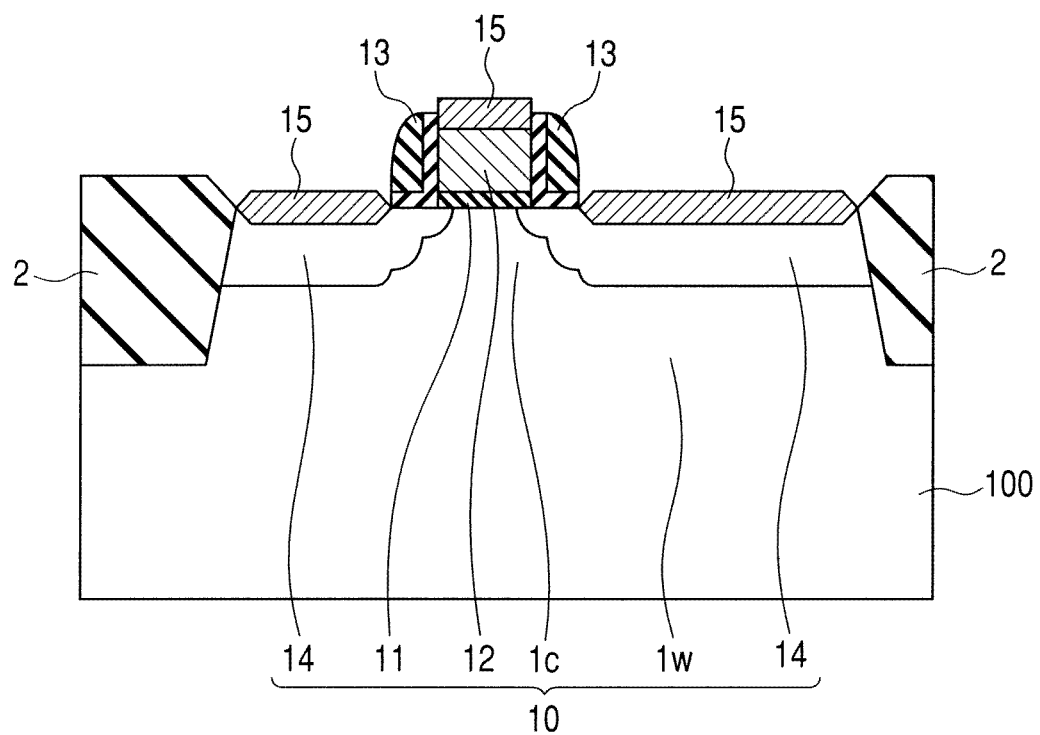
FIG. 18 is a cross-sectional view illustrating a manufacturing step after that illustrated in FIG. 17.

As illustrated in FIG. 18, a metal film is formed by using sputtering. The resulting metal film is then patterned to form a metal film 15 on the upper surface of the impurity region 14 and the upper surface of the gate electrode 12, whereby a MOS transistor 10 is formed.

Figure 19:
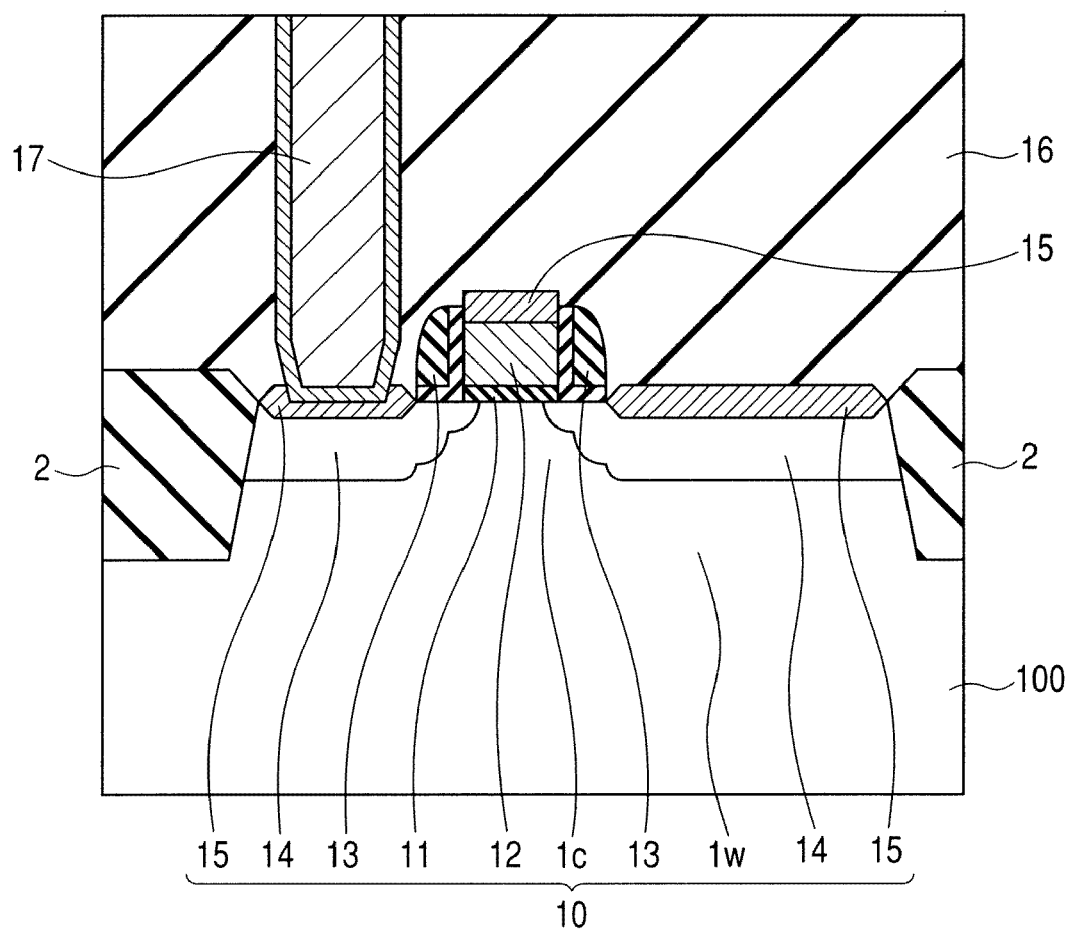
FIG. 19 is a cross-sectional view illustrating a manufacturing step after that illustrated in FIG. 18.

As illustrated in FIG. 19, after formation of the MOS transistor 10, an insulating layer 16 comprised of a silicon oxide film or the like is formed so as to cover the MOS transistor 10.

The insulating layer 16 thus formed is subjected to photolithography and etching to form a contact hole. The contact hole reaches the metal film 15 formed on the impurity region 14.

Then, a barrier metal is formed on the inner surface of the contact hole by using sputtering or the like. After formation of the barrier metal, the contact hole is filled with a conductive film such as copper. The resulting conductive film is subjected to CMP (chemical mechanical polishing) to form a unit contact portion 17.

Figure 20:
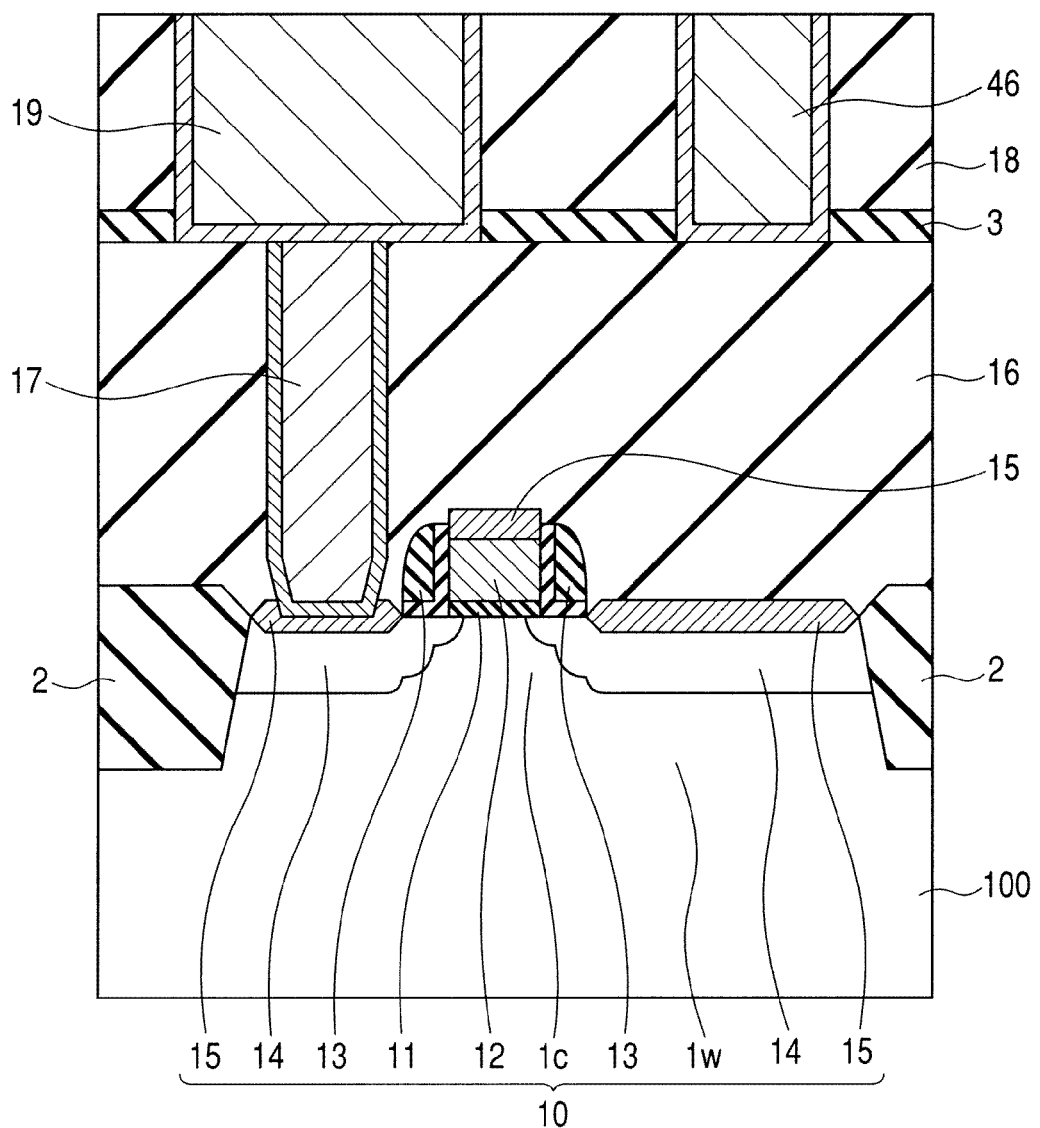
FIG. 20 is a cross-sectional view illustrating a manufacturing step after that illustrated in FIG. 19.

Then, as illustrated in FIG. 20, an insulating layer 3 and an insulating layer 18 are formed successively on the upper surface of the insulating layer 16. A trench is formed in the insulating layer 18 and the insulating layer 3. A barrier metal is formed in the trench thus formed, followed by filling with a conductive film. The resulting conductive film is planarized to form a unit contact portion 19 and a source interconnect 46 in the insulating layer 18 and the insulating film 3.

Figure 21:
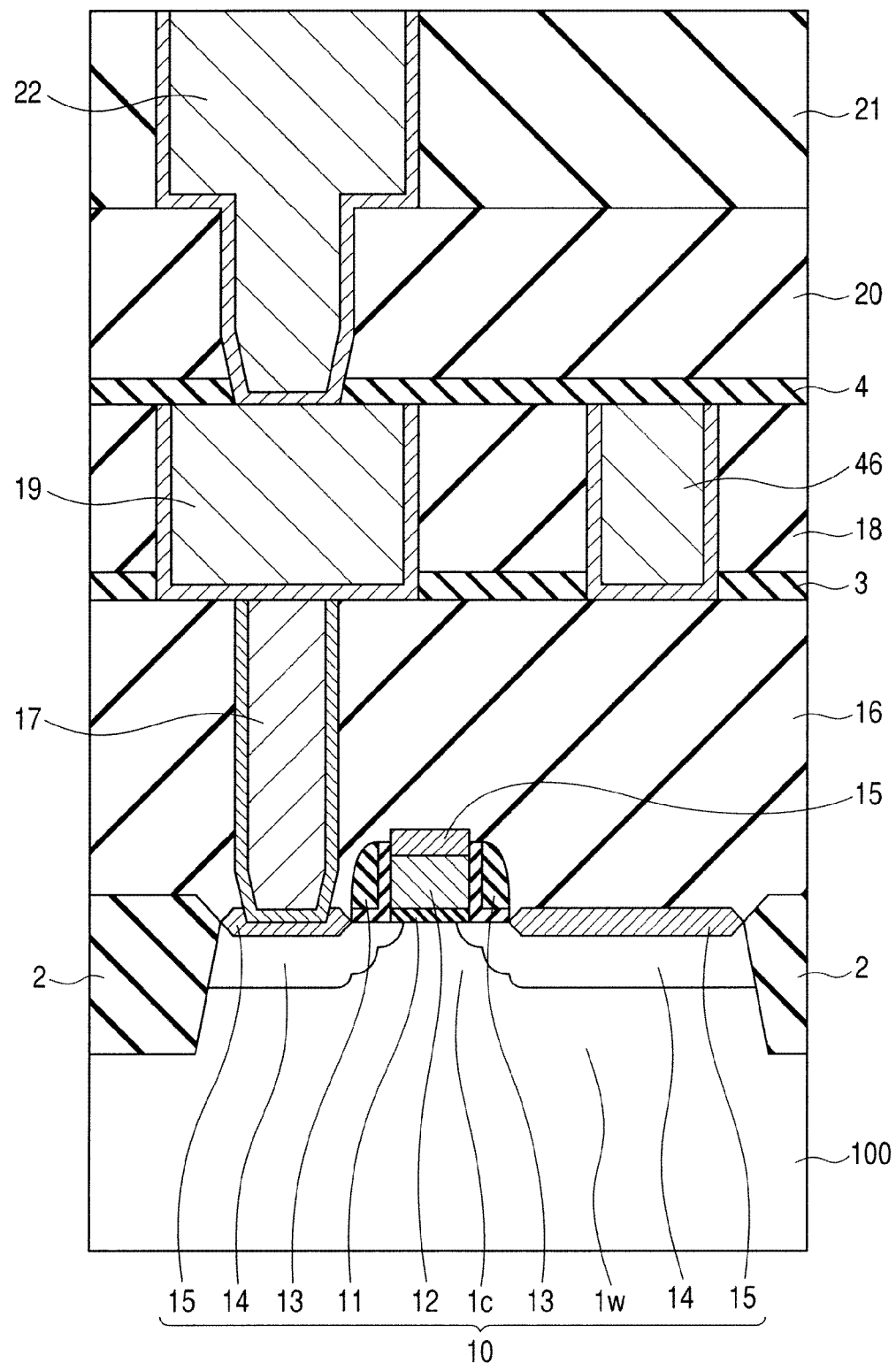
FIG. 21 is a cross-sectional view illustrating a manufacturing step after that illustrated in FIG. 20.

Then, as illustrated in FIG. 21, insulating films 4, 20, and 21 are formed successively. A hole is then made in the insulating films 4, 20, and 21 and a barrier metal is formed on the inner surface of the hole. A conductive film is filled on the barrier metal. The resulting conductive film is planarized to form a unit contact portion 22.

Figure 22:
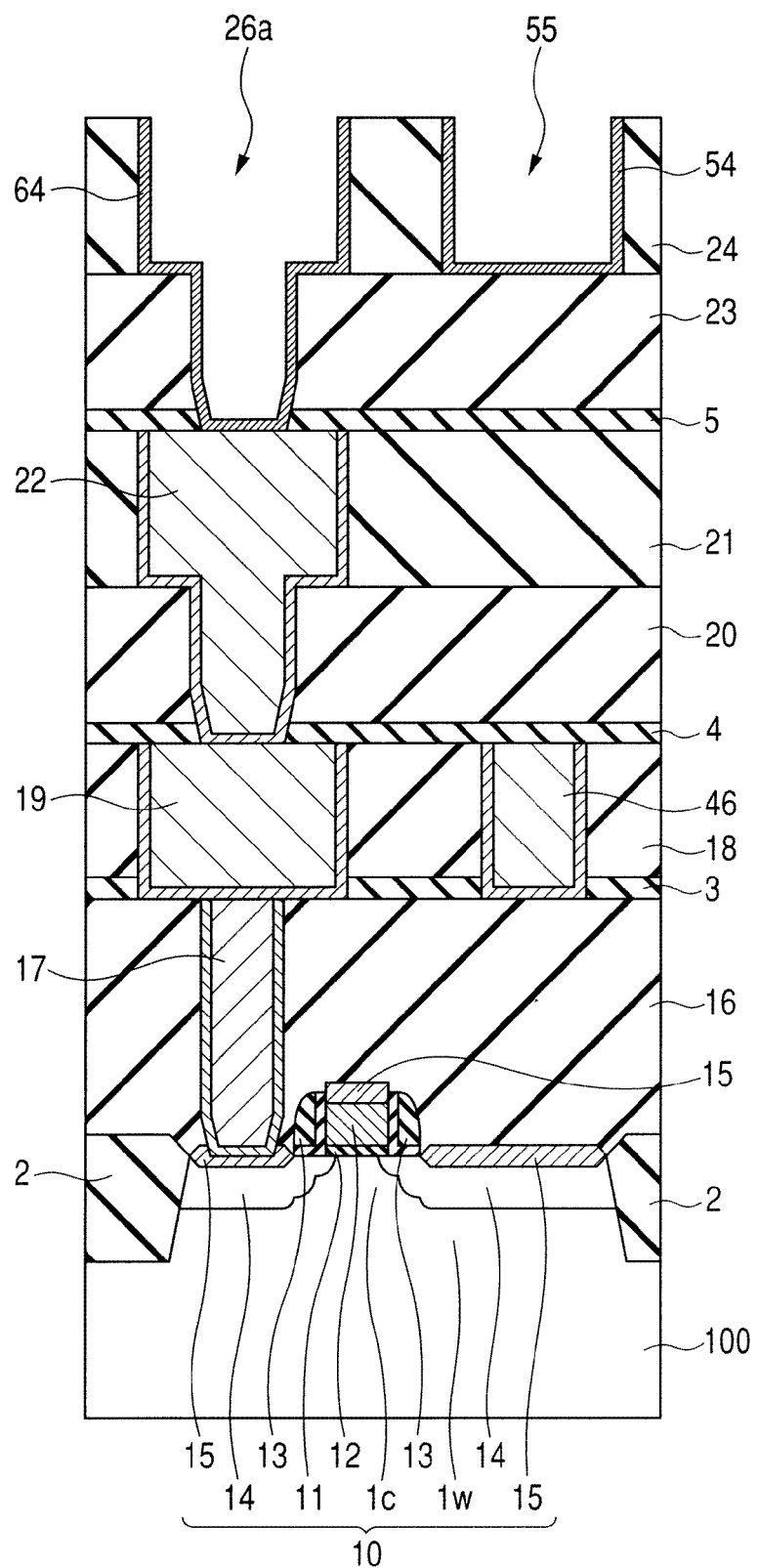
FIG. 22 is a cross-sectional view illustrating a manufacturing step after that illustrated in FIG. 21.

As illustrated in FIG. 22, insulating films 5, 23, and 24 are formed successively on the upper surface of the insulating layer 21. Then, a contact hole 26a is formed in the insulating films 5, 23, and 24 and at the same time, a digit line trench 55 is formed in the insulating film 24. A barrier metal 64 is formed in the contact hole 26a and at the same time, a barrier metal 54 is formed on the inner surface of the digit line trench 55.

Figure 23:
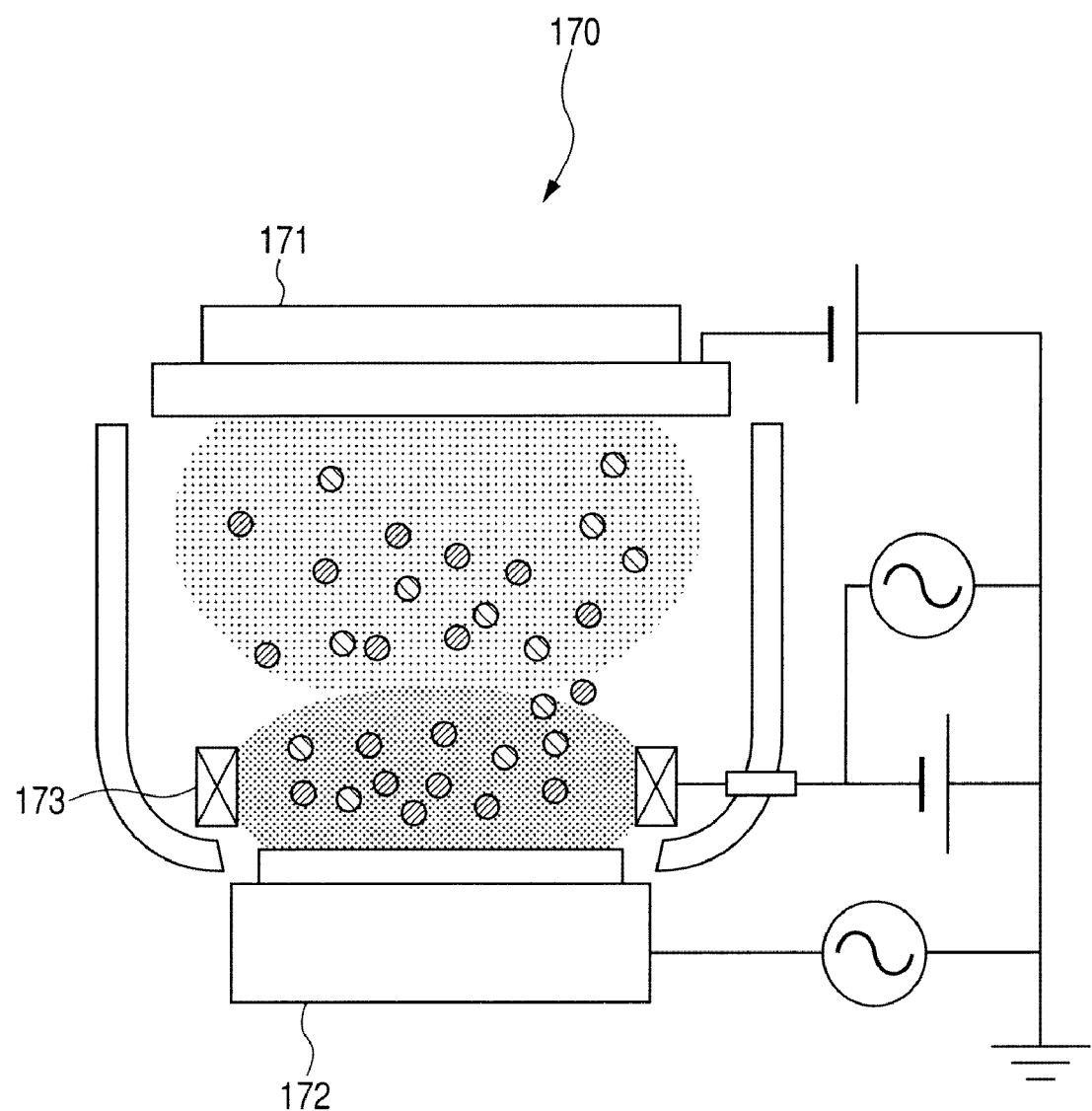
FIG. 23 is a schematic view of a sputtering apparatus 170.

These barrier metals 54 and 64 are formed by using a sputtering apparatus 170 as illustrated in FIG. 23.

The sputtering apparatus 170 is placed in a chamber and is equipped with a stage 172 having an upper surface on which a semiconductor substrate during a manufacturing procedure is placed, a target 171 on which a target is placed, a DC coil 173, and a high-frequency coil 174.

Directivity of the particles in the chamber can be adjusted by using a magnetic force generated from the DC coil 173 and the high-frequency coil 174.

Upon formation of the barrier metals 54 and 64, an AC voltage of about from 200 W to 230 W is applied to the stage 172. The side coverage ratio of the barrier metals 54 and 64 can be increased.

The term "side coverage ratio" as used herein means a ratio of a film forming rate on the inner side surface of the contact hole 26a and the digit line trench 55 relative to a film forming rate on the upper surface of the insulating layer 24 as illustrated in FIG. 22.

After formation of the barrier metals 54 and 64, a cladding layer 52 and a cladding layer 62 as illustrated in FIGS. 5 and 6 are formed, respectively.

Upon forming the cladding layers 52 and 62, a voltage of, for example, about 2000 W is applied to the high-frequency coil 174 and a voltage of, for example, from about 0 W to 500 W is applied to the DC coil 173. The pressure in the chamber is adjusted to about 0.2 Pa. Further, a predetermined voltage is applied to the target 171 and the stage 172.

Forming the cladding layers under the above-described conditions makes a film forming rate on the inner side surface of the barrier metal 54 higher than a film forming rate on the bottom of the barrier metal 54.

This means that a side coverage ratio upon forming the cladding layers becomes higher than a side coverage ratio upon forming the barrier metal 54.

Incidentally, a side coverage ratio upon forming the cladding layers is a ratio of a film forming rate of each of the cladding layers on the inner side surfaces of the barrier metals 54 and 64 relative to a film forming rate of the cladding layer on the upper surface of the insulating layer 24.

The thickness of the sidewall portion 52b of the cladding layer 52 formed at such a side coverage ratio therefore becomes greater than the thickness of the bottom wall portion 52a.

After formation of the cladding layers as described above, the barrier metals 53 and 63 are formed on the upper surfaces of the cladding layers, respectively. The barrier metals 53 and 63 are formed under film forming conditions similar to those employed for the formation of the barrier metals 54 and 64. Film forming conditions of the cladding layer 52 shown in FIGS. 9 to 14 will be described later.

Figure 24:
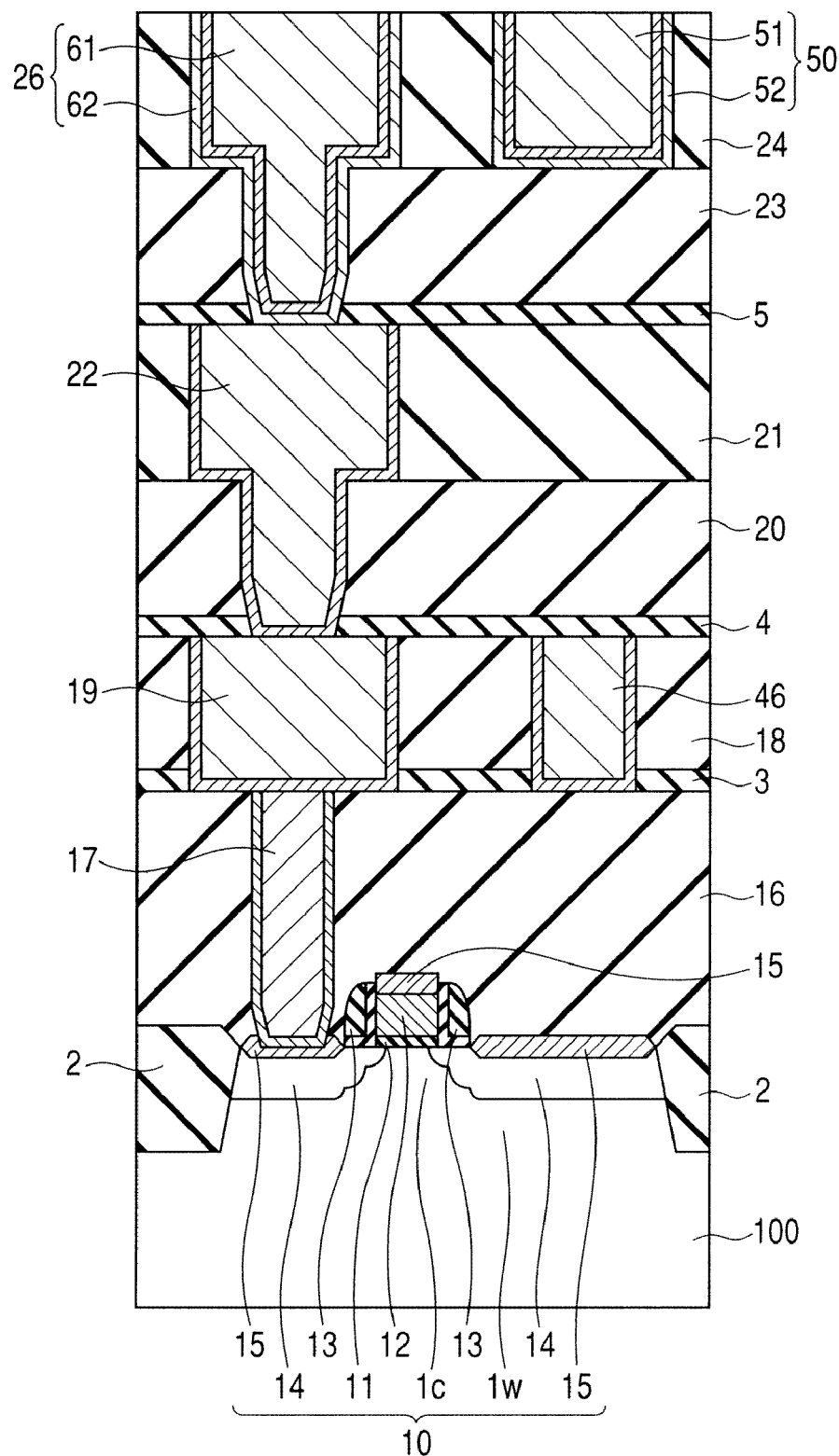
FIG. 24 is a cross-sectional view illustrating a manufacturing step after that illustrated in FIG. 22.

After formation of the barrier metals 53 and 63, a conductive film is filled on the barrier metals 53 and 63, respectively. After filling the conductive film, the upper surface of the insulating layer 24 is planarized by CMP as illustrated in FIG. 24 to form a unit contact portion 26 as illustrated in FIG. 6 and a digit line 50 as illustrated in FIG. 5. The unit contact portion 26 can be formed simultaneously with the formation of the digit line 50.

The interlayer insulating layer 9 can be formed by successively stacking insulating layers 16, 3, 18, 4, 20, 21, 5, 23, and 24 one after another in such a manner.

Further, the coupling interconnect 8 can be formed by successively forming unit contact portions 17, 19, 22, and 26.

Figure 25:
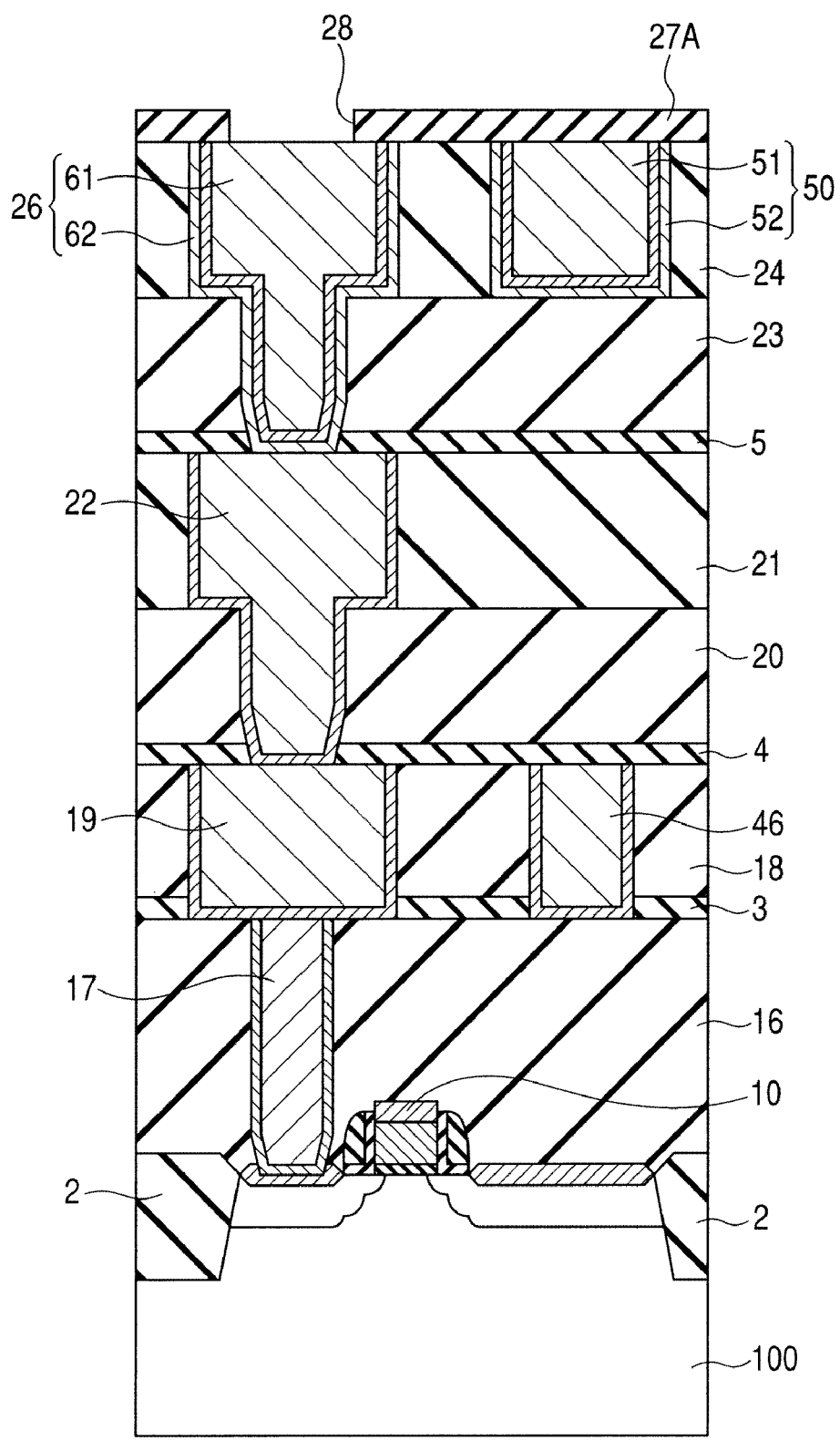
FIG. 25 is a cross-sectional view illustrating a manufacturing step after that illustrated in FIG. 24.

Then, as illustrated in FIG. 25, an insulating film 27A made of a silicon oxide film or the like is formed on the upper surface of the insulating layer 24. A through-hole 28 is formed in this insulating film.

Figure 26:
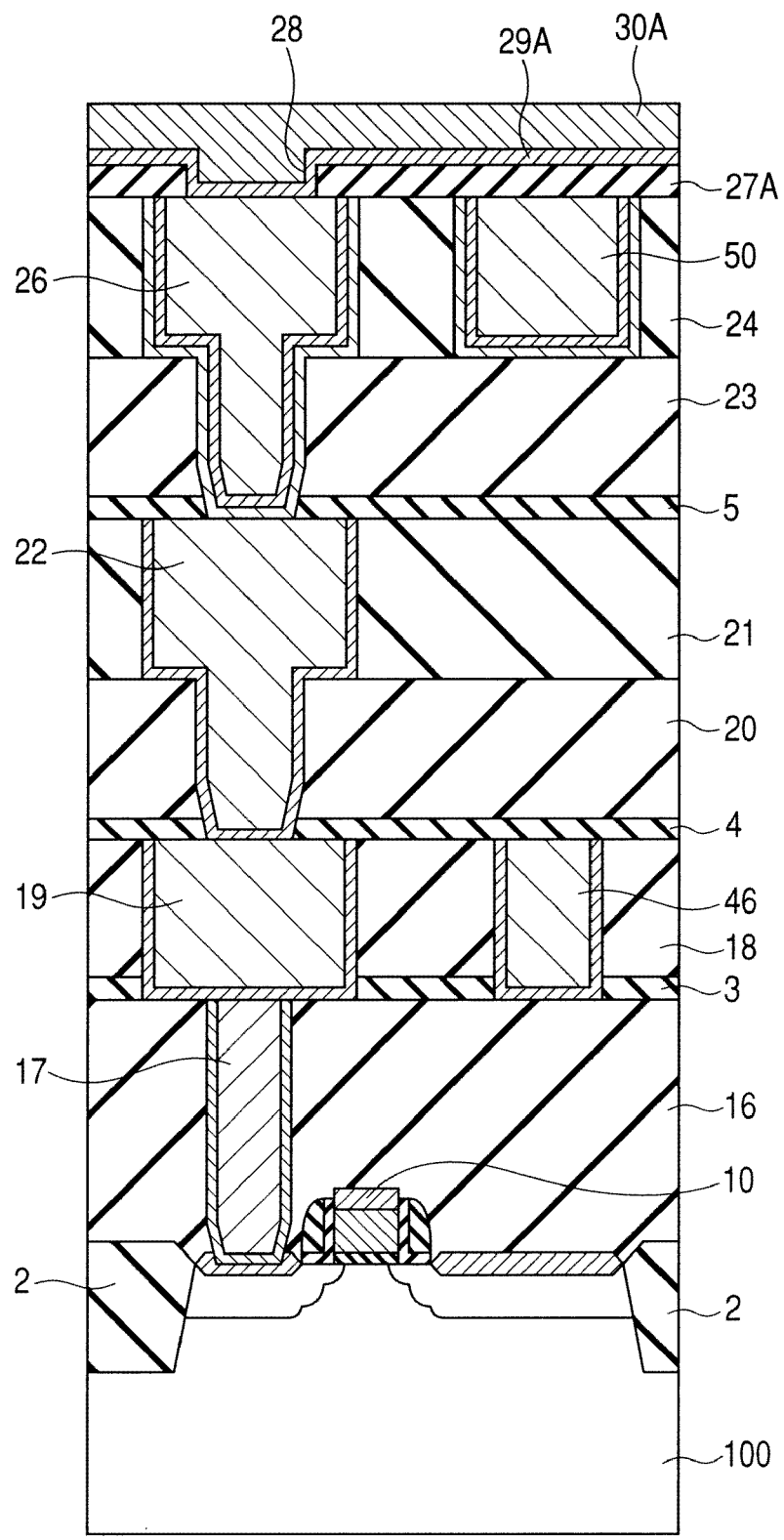
FIG. 26 is a cross-sectional view illustrating a manufacturing step after that illustrated in FIG. 25.

As illustrated in FIG. 26, a barrier metal 29A is formed on the insulating film 27A and the inner peripheral surface of the through-hole 28. A conductive film 30A is then deposited on this barrier metal 29A.

Figure 27:
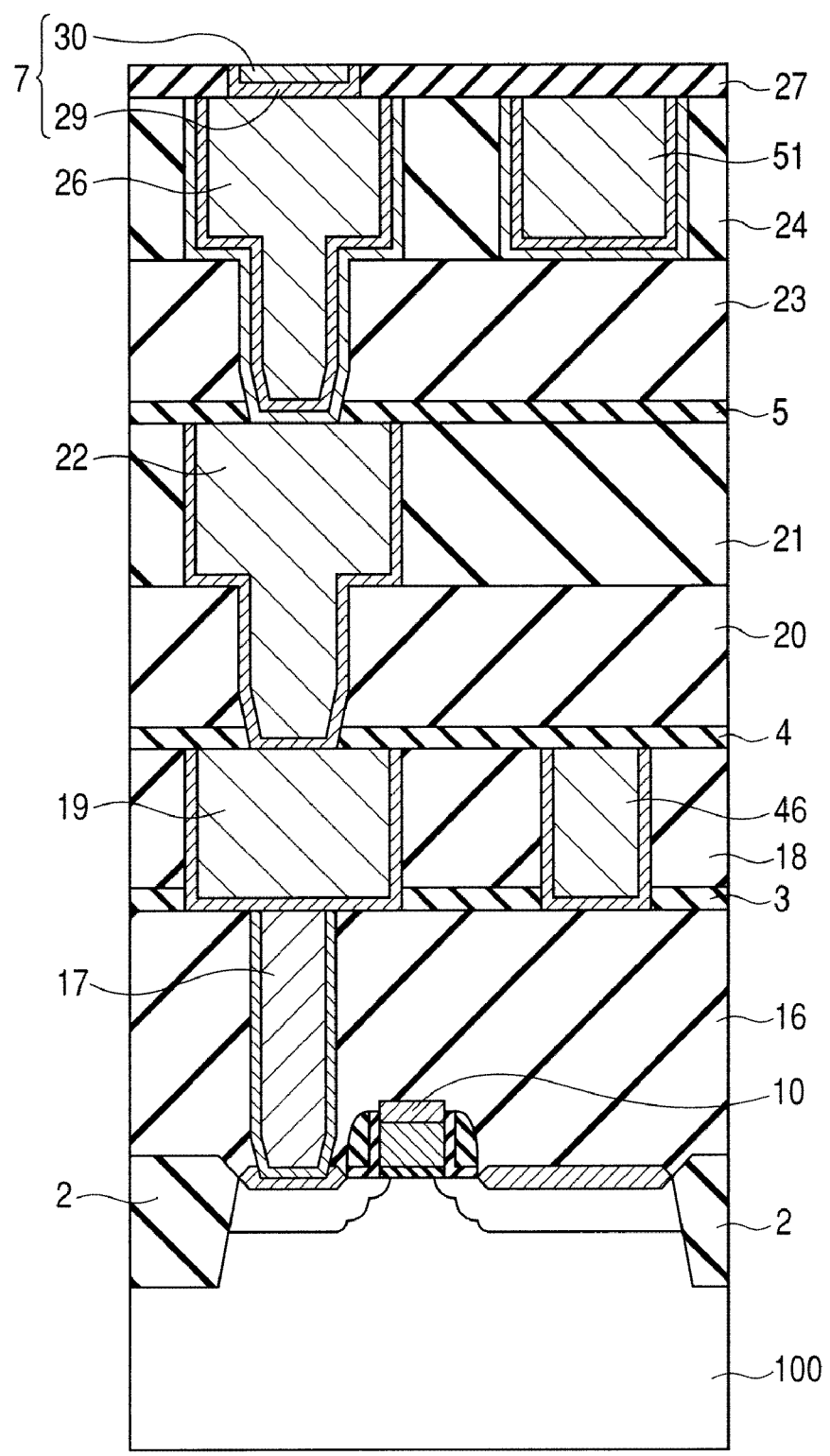
FIG. 27 is a cross-sectional view illustrating a manufacturing step after that illustrated in FIG. 26.

As illustrated in FIG. 27, the barrier metal 29A and the conductive film 30A formed on the insulating film 27A are then removed by using CMP with the insulating 27A as a stopper film.

As a result, a coupling portion 7 is formed. On the other hand, the upper surface of the insulating film 27A is planarized and a flat insulating film 27 is formed.

Figure 28:
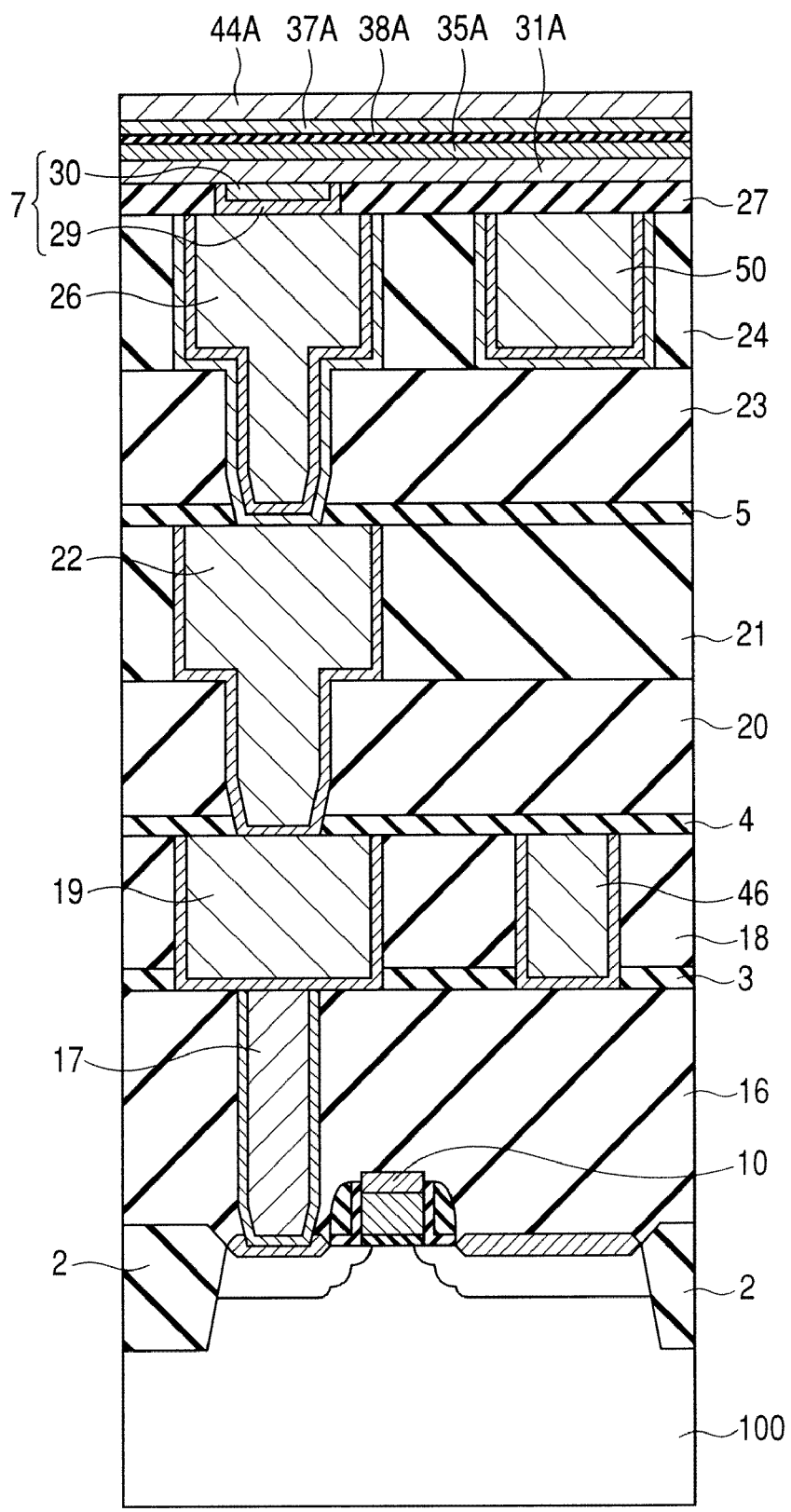
FIG. 28 is a cross-sectional view illustrating a manufacturing step after that illustrated in FIG. 27.

As illustrated in FIG. 28, a conductive film 31A made of tantalum (Ta) or the like is formed. On this conductive film 31A is formed a conductive film 35A containing, for example, platinum (Pt), manganese (Mn), nickel (Ni), ruthenium (Ru), cobalt (Co), iron (Fe), or boron (B).

An insulating film 38A comprised of, for example, aluminum oxide ($AlO_x$) or magnesium oxide (MgO) is formed on the conductive film 35A.

An alloy film 37A containing at least two metals of, for example, nickel (Ni), iron (Fe), cobalt (Co), and boron (B) is formed on the upper surface of this insulating film 38A.

A conductive film 44A made of, for example, ruthenium (Ru) is formed on the alloy film 37A.

Figure 29:
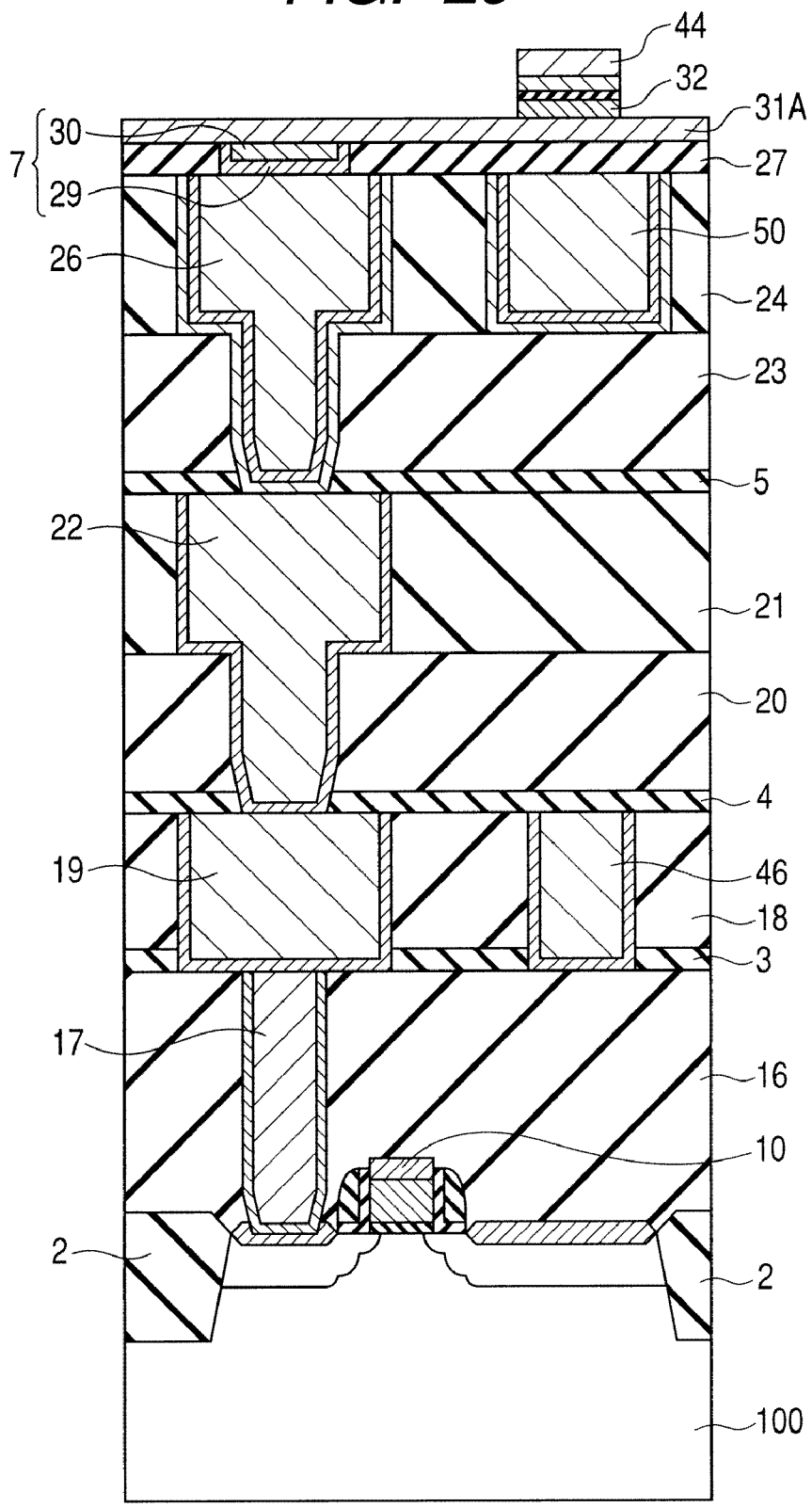
FIG. 29 is a cross-sectional view illustrating a manufacturing step after that illustrated in FIG. 28.

As illustrated in FIG. 29, the conductive film 35A, the insulating film 38A, the alloy film 37A, and the conductive film 44A are patterned to form a magnetic storage element 32 and, on the upper surface of the magnetic storage element 32, a metal film 44.

Figure 30:
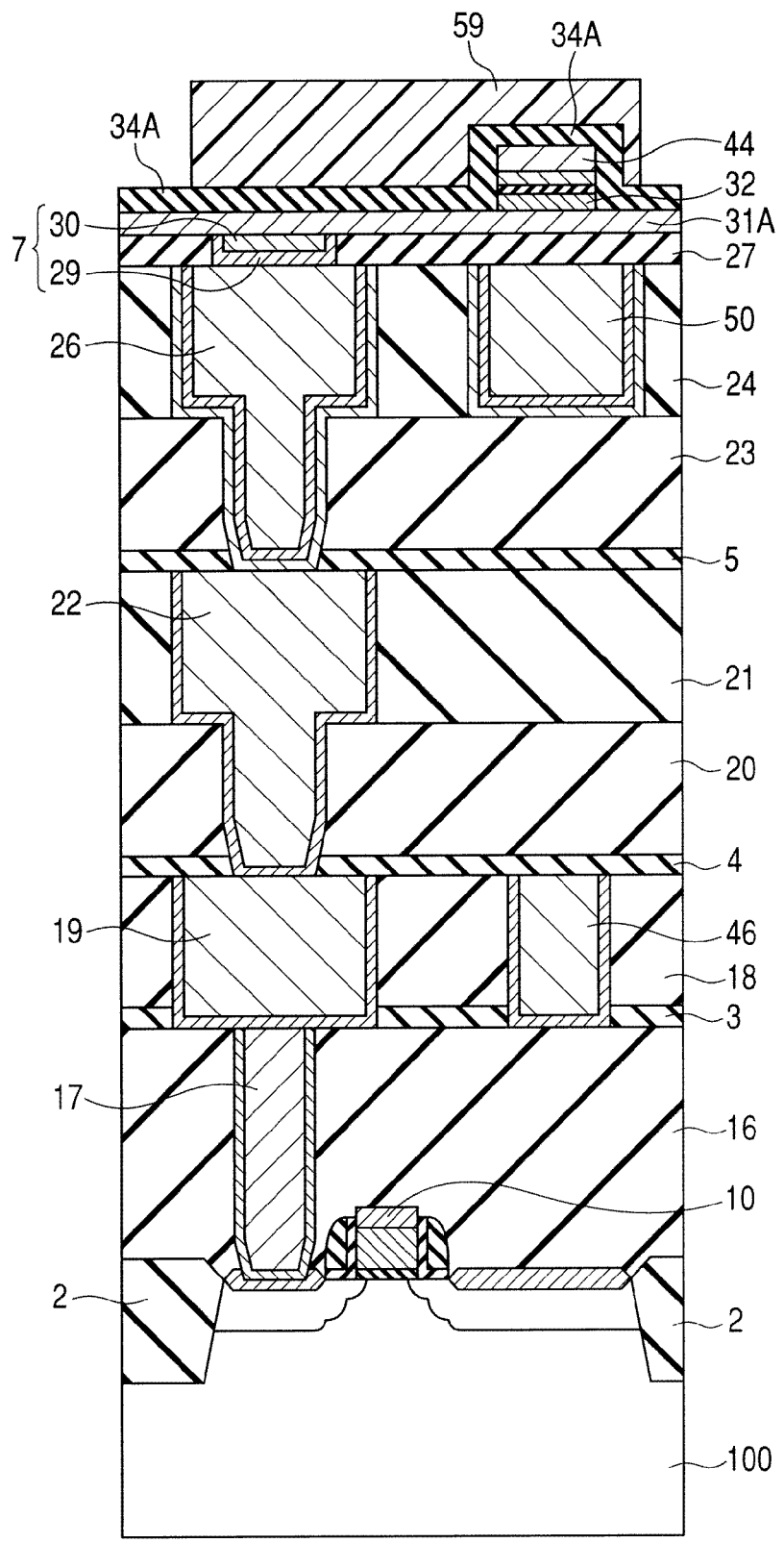
FIG. 30 is a cross-sectional view illustrating a manufacturing step after that illustrated in FIG. 29.

As illustrated in FIG. 30, an insulating film 34A made of a silicon nitride film or the like is formed as a liner film on the conductive film 31A so as to cover the magnetic storage element 32.

A resist film is formed on the insulating film 34A. The resist film is subjected to patterning for the formation of a lead interconnect 31 and a resist pattern 59 is formed.

Figure 31:
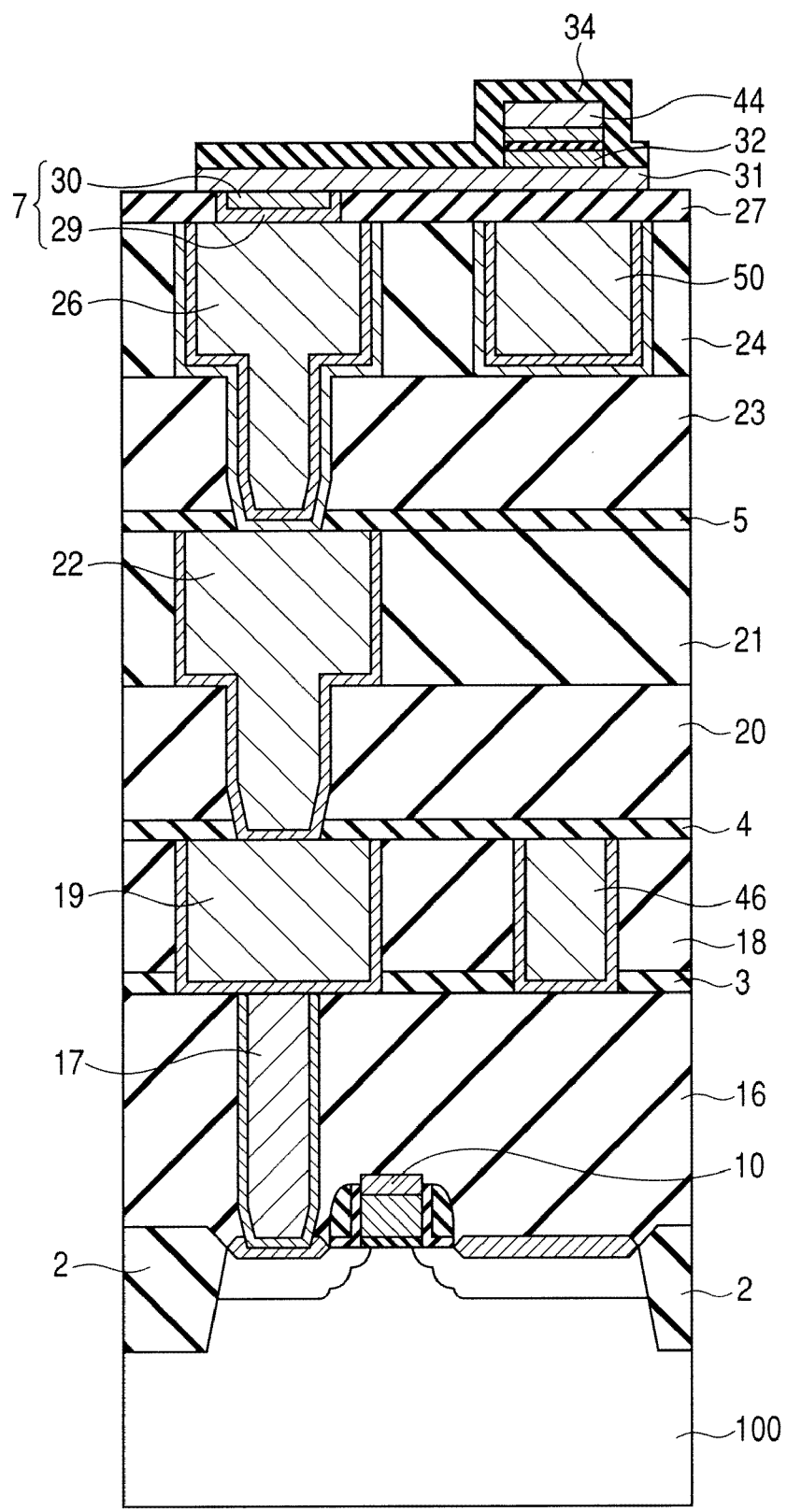
FIG. 31 is a cross-sectional view illustrating a manufacturing step after that illustrated in FIG. 30.

With the resulting resist pattern as a mask, the insulating film 34A and the metal film 31A are patterned to form an insulating film 34 and a lead interconnect 31 as illustrated in FIG. 31.

Figure 32:
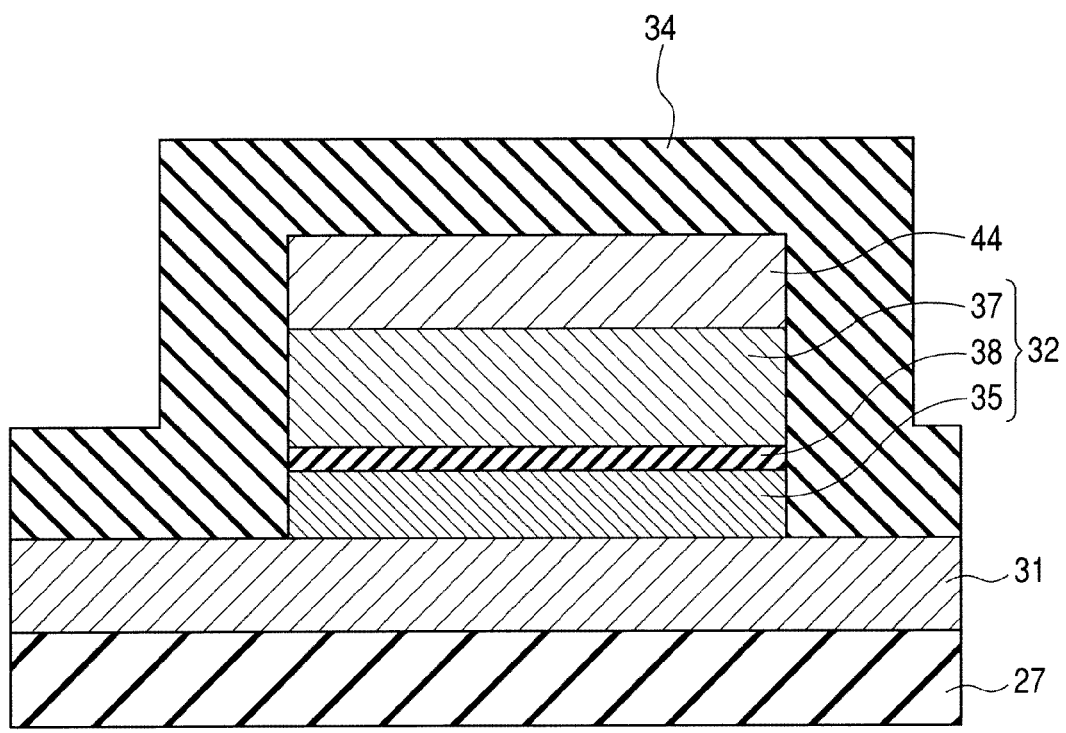
FIG. 32 is a cross-sectional view illustrating the magnetic storage element 32 and vicinity thereof.

In FIG. 32, the upper surface of the flat insulating film 27 is planarized by using CMP or the like. The lead interconnect 31 is formed on the planarized upper surface of the flat insulating film 27 so that the upper surface itself of the lead interconnect 31 is also substantially planarized.

As a result, a magnetization fixed layer 35, a tunnel insulating film 38, and a magnetization free layer 37 to be formed on the upper surface of the lead interconnect 31 are free of irregularities.

Figure 33:
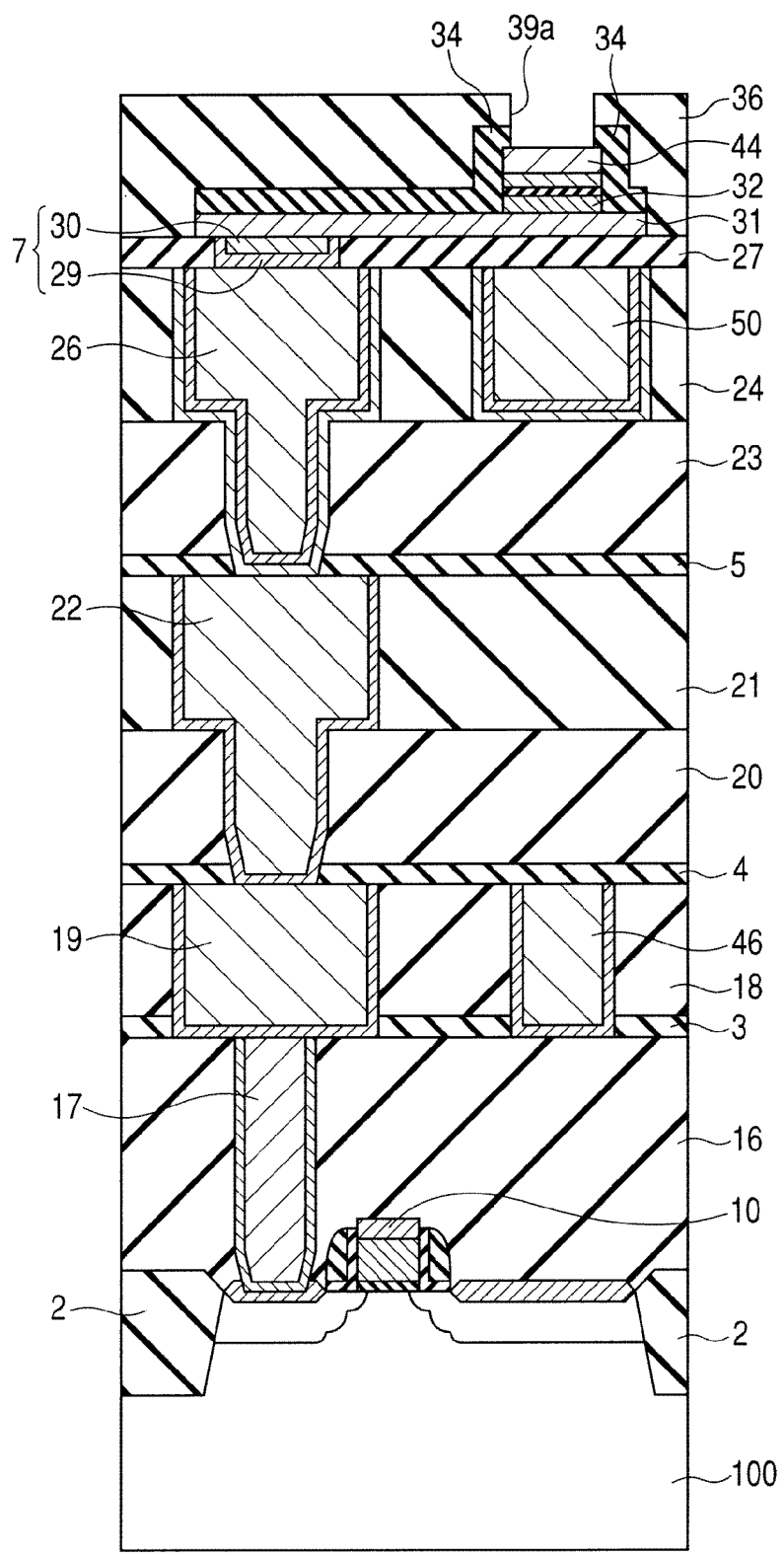
FIG. 33 is a cross-sectional view illustrating a manufacturing step after that illustrated in FIG. 31.

Then, as illustrated in FIG. 33, an insulating film made of a silicon oxide film or the like is formed. The resulting insulating film is subjected to chemical mechanical polishing to form an upper insulating film 36 having a predetermined thickness as illustrated in FIG. 33. A resist pattern for the formation of a contact hole 39a is formed on the upper insulating film 36. With this resist pattern, a contact hole 39a is formed in the unit contact portion 26.

Figure 34:
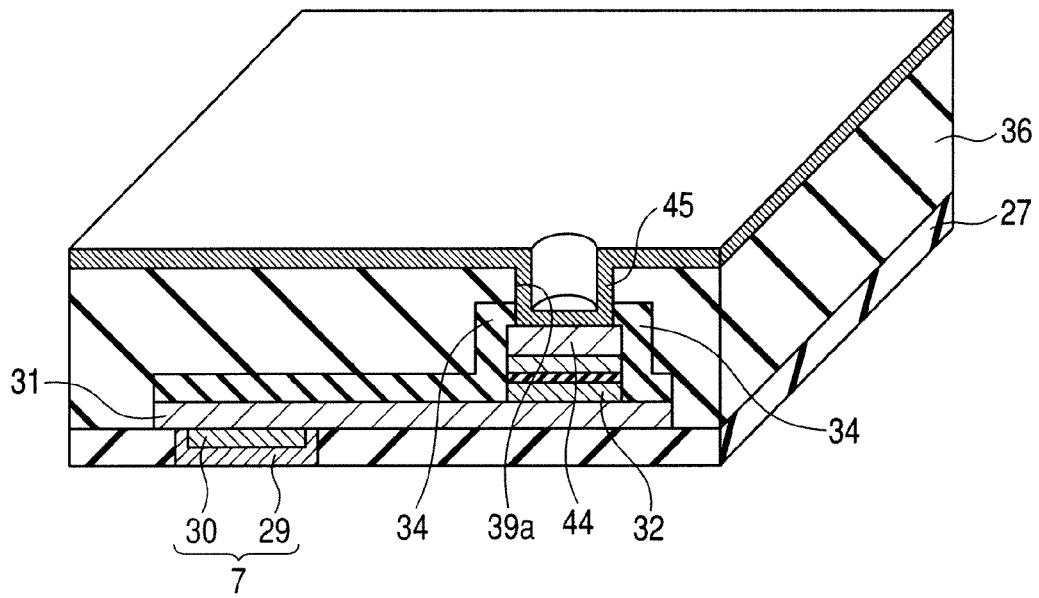
FIG. 34 is a cross-sectional view illustrating a manufacturing step after that illustrated in FIG. 33.

In FIG. 34, a barrier metal is formed on the upper insulating film 36 and on the inner surface of the contact hole 39a.

Figure 35:
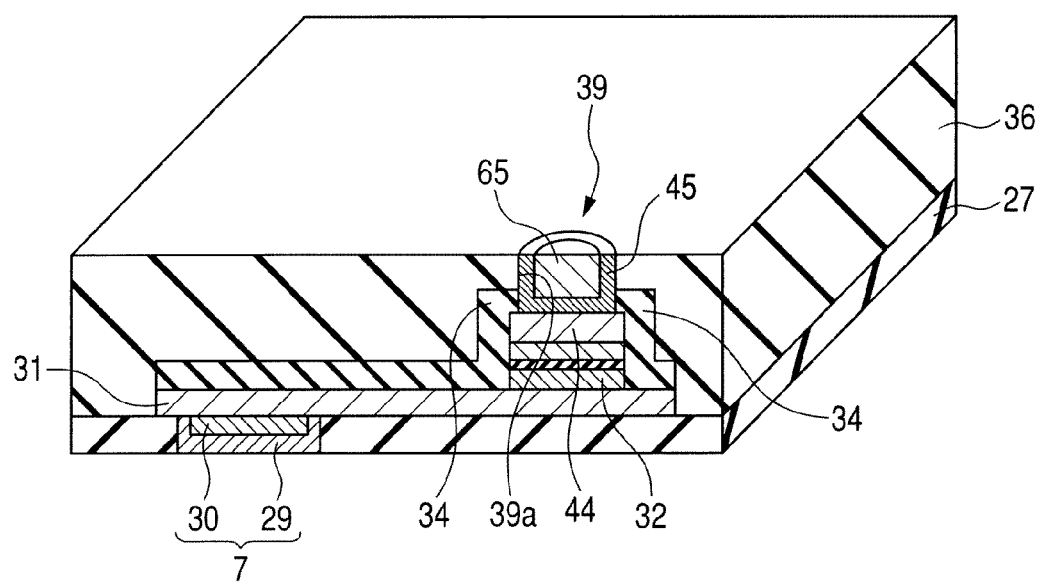
FIG. 35 is a cross-sectional view illustrating a manufacturing step after that illustrated in FIG. 34.
Figure 36:
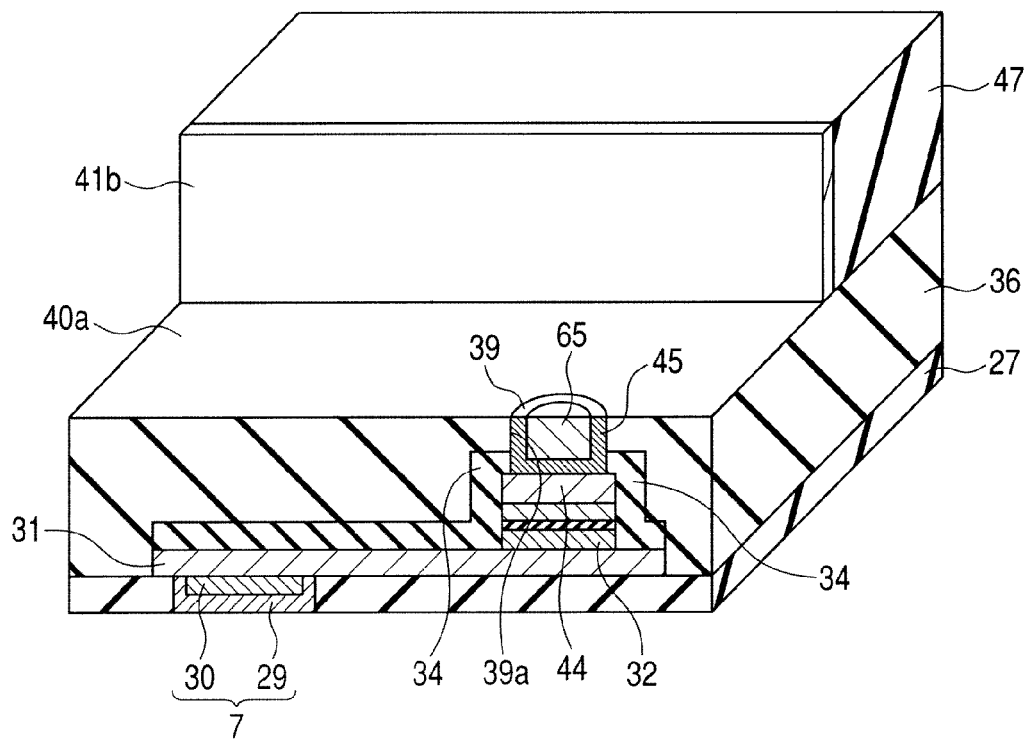
FIG. 36 is a cross-sectional view illustrating a manufacturing step after that illustrated in FIG. 35.

As illustrated in FIG. 35, a conductive film is filled in the contact hole 39a in which the barrier metal has been formed. The resulting conductive film and the barrier metal are planarized to form a barrier metal 45 and a conductive film 65 filled in the contact hole 39a, by which a contact portion 39 is formed. In FIG. 36, an upper insulating film 47 is then formed on the upper surface of the upper insulating film 36 in which the contact portion 39 has been formed.

A bit line trench 40a is then formed by patterning the upper insulating film 47. Then, a cladding layer is formed. The cladding layer thus formed is etched to form a sidewall portion 41b.

Figure 37:
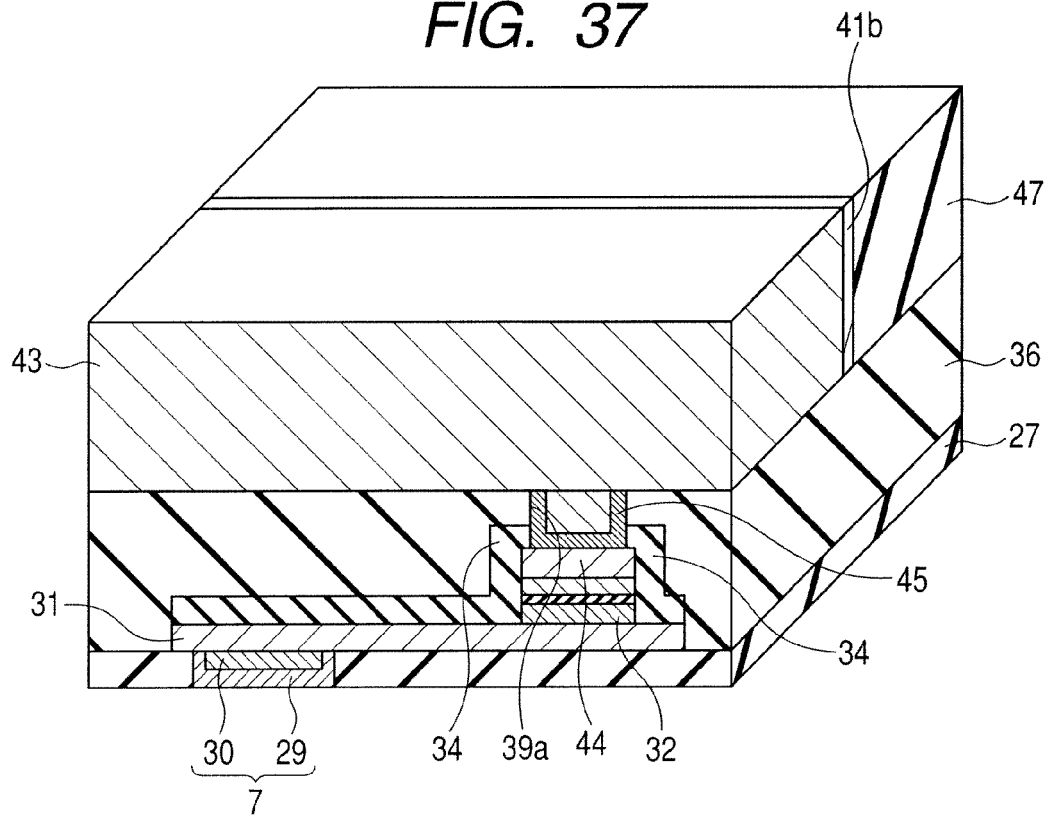
FIG. 37 is a cross-sectional view illustrating a manufacturing step after that illustrated in FIG. 36.
Figure 38:
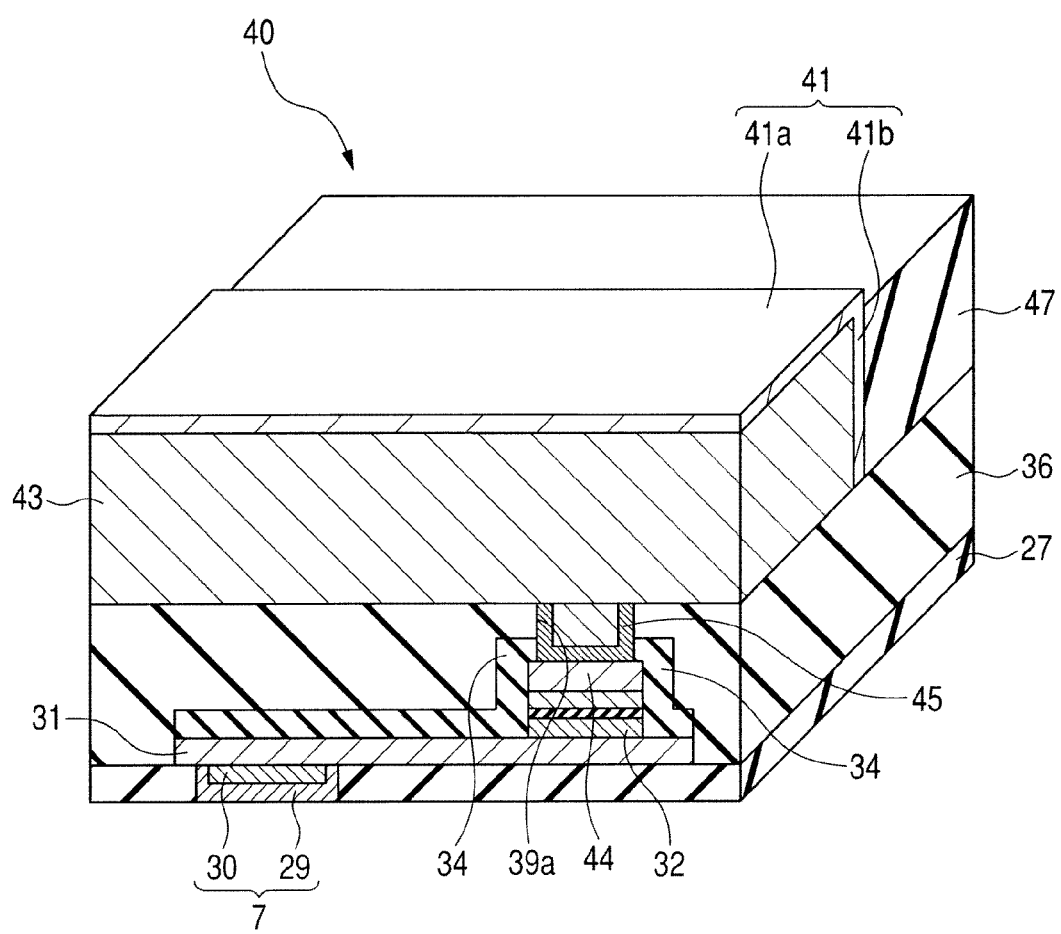
FIG. 38 is a cross-sectional view illustrating a manufacturing step after that illustrated in FIG. 37.

As illustrated in FIG. 37, a conductive film is filled in the bit line trench 40a for which a sidewall portion 41b has been formed. The conductive film is planarized to form an interconnect body portion 43. As illustrated in FIG. 38, an upper wall portion 41a is formed on the upper surface of the interconnect body portion 43 to configure a cladding layer 41 and also configure a bit line 40. The thickness of the upper wall portion 41a is made smaller than the thickness of the sidewall portion 41b.

In the example shown in from FIG. 1 to FIG. 38, the bit line 40 and the magnetic storage element 32 are coupled with the contact portion 39, but the contact portion 39 may be omitted.

Figure 39:
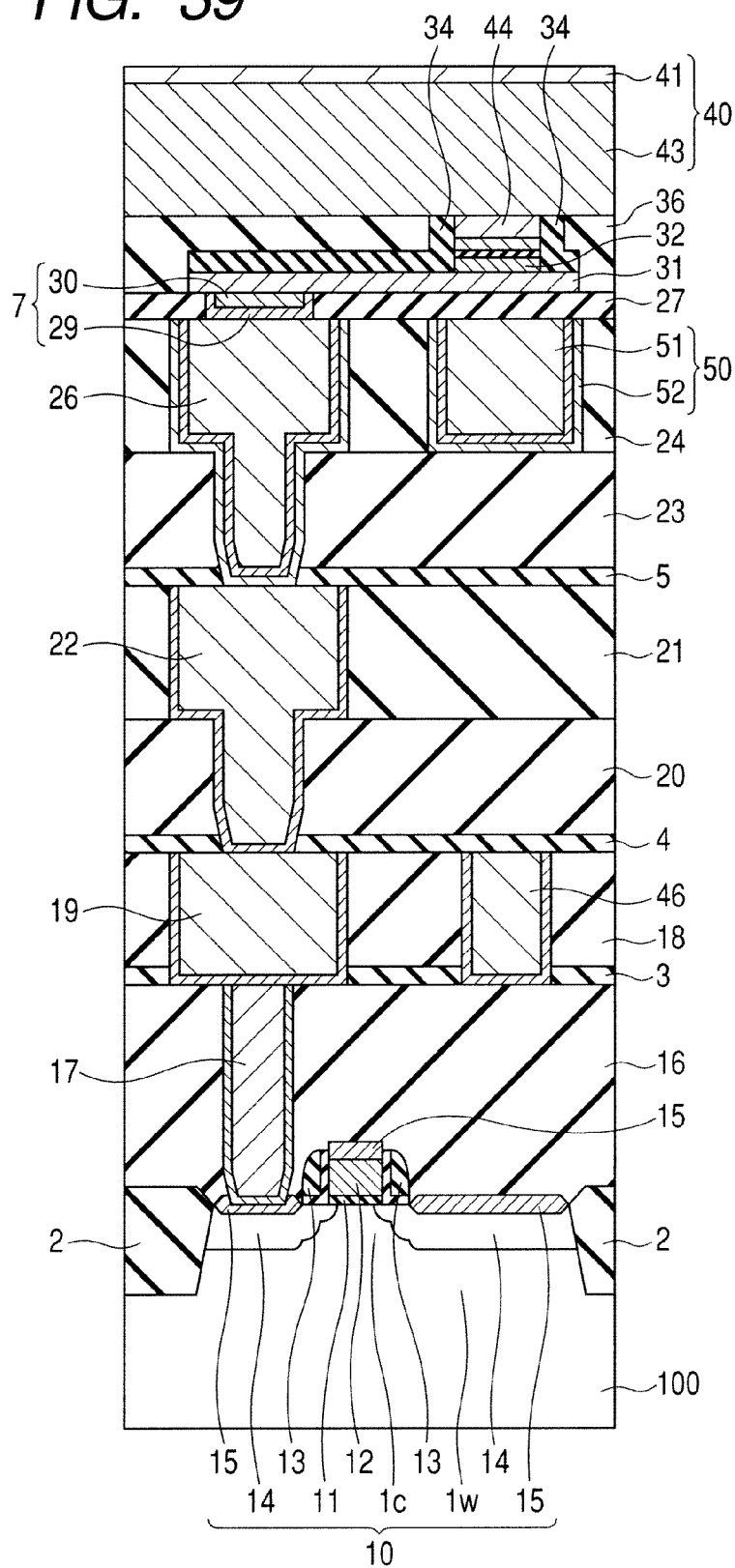
FIG. 39 is a cross-sectional view illustrating a modification example of the semiconductor device 200 according to the present embodiment.

FIG. 39 is a cross-sectional view illustrating a modification example of the semiconductor device 200 according to the present embodiment. As illustrated in FIG. 39, the bit line 40 may be coupled directly to the metal film 44.

Figure 40:
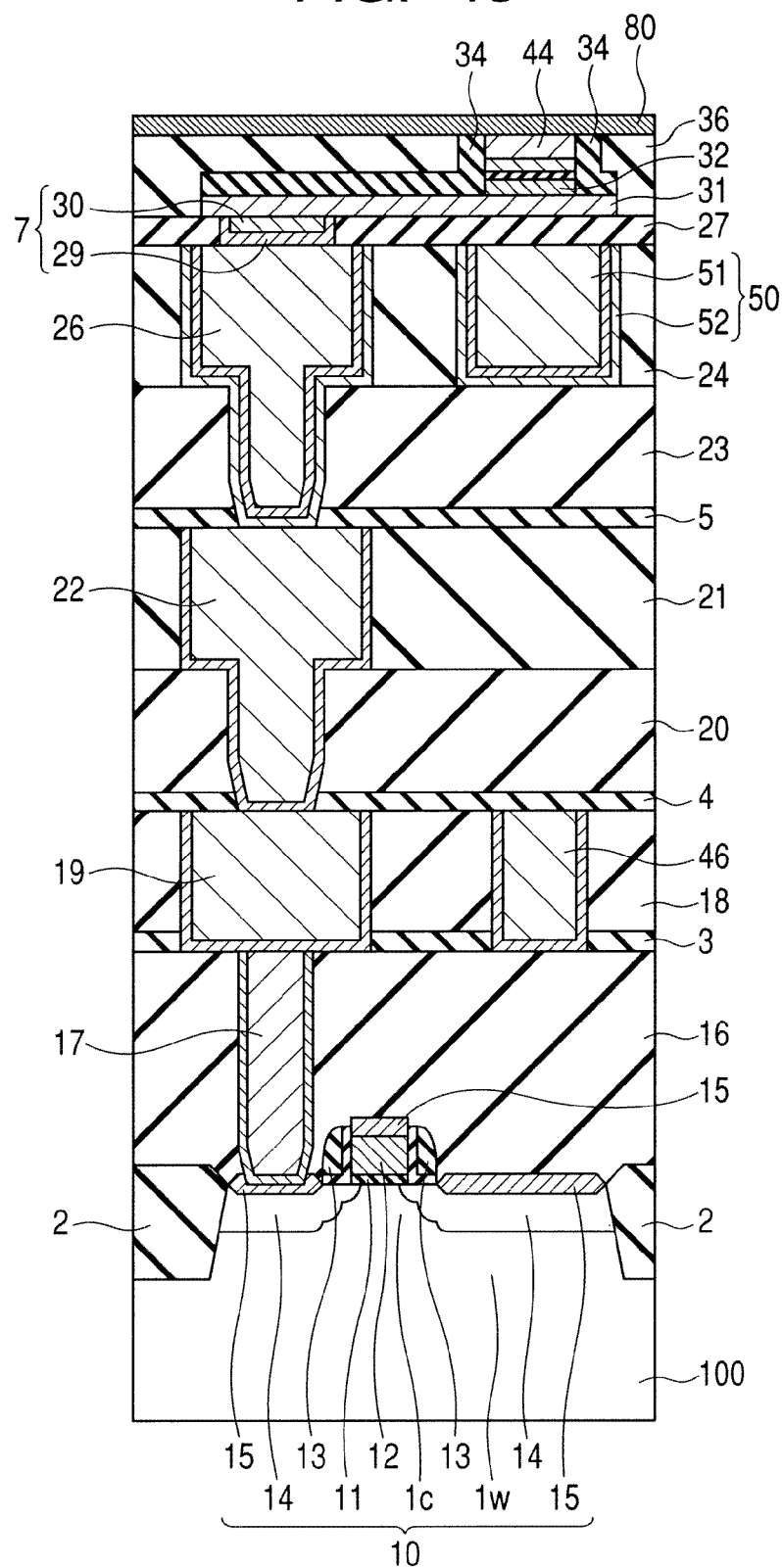
FIG. 40 is a cross-sectional view illustrating a first manufacturing step of manufacturing steps of the semiconductor device 200 illustrated in FIG. 39.

The semiconductor device 200 as illustrated in FIG. 39 is formed by forming, in FIG. 40, an upper insulating film (not illustrated) on the upper surface of the upper insulating film 36 and then forming a bit line trench in this upper insulating film.

A cladding layer 80 is formed on the inner surface of the bit line trench thus formed. The cladding layer 80 is then etched to leave a portion of the cladding layer on the inner side surface of the bit line trench and remove the other portion.

Figure 41:
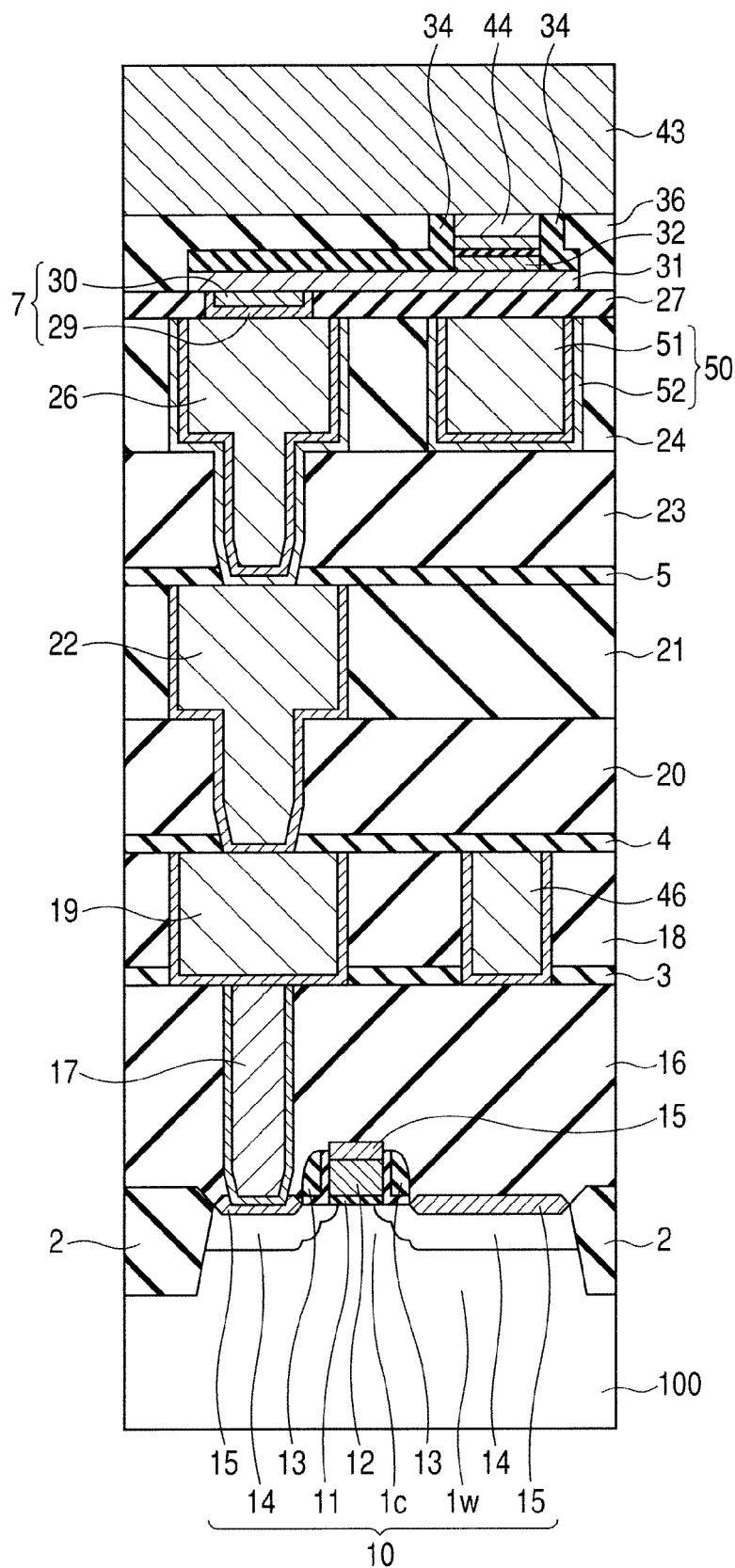
FIG. 41 is a cross-sectional view illustrating a manufacturing step after that illustrated in FIG. 40.

Then, as illustrated in FIG. 41, an interconnect body portion 43 is formed, followed by the formation of a cladding layer on the upper surface of the interconnect body portion 43, whereby a cladding layer 41 as illustrated in FIG. 39 is formed. In such a manner, the semiconductor device 200 illustrated in FIG. 39 can be manufactured.

Formation methods of the cladding layer 52 in various shapes will next be described referring to FIGS. 42 to 53.

Figure 42:
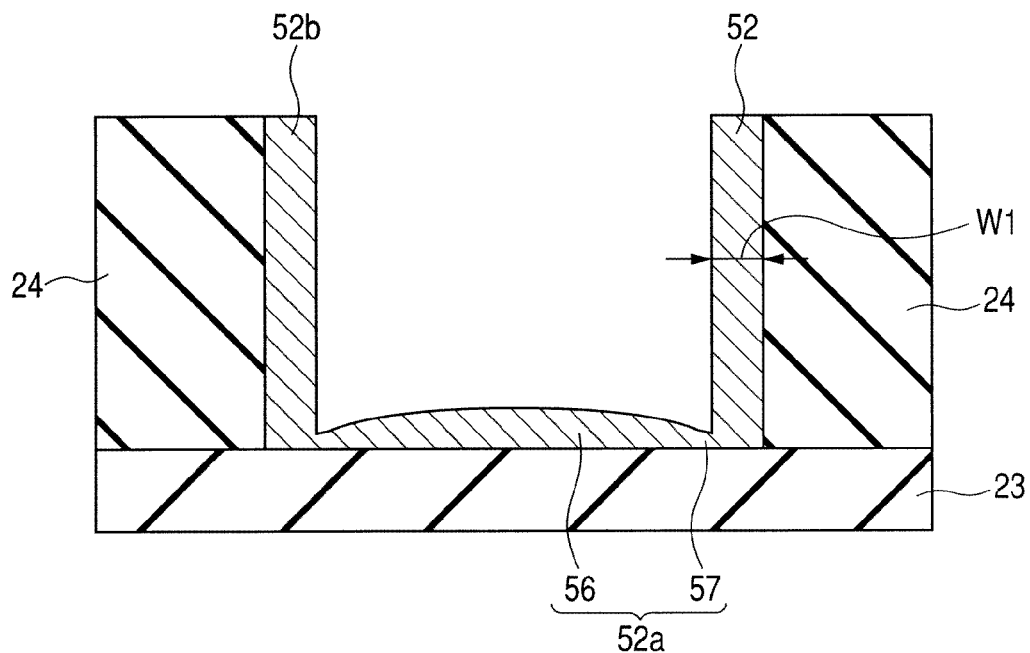
FIG. 42 is a cross-sectional view illustrating a cladding layer 52 and vicinity thereof.

First, a method of forming the cladding layer 52 having, on the bottom wall portion 52a thereof, a thick film portion 56 and a thin film portion 57 as illustrated in FIG. 42 will be described.

In the sputtering apparatus 170 illustrated in FIG. 23, a DC power of from 2 kW to 5 kW is applied to the target 171. A high-frequency power of from 200 W to 400 W is applied to the stage 172. A high-frequency power of 2000 W and a DC power of from 0 W to 500 W are applied to the coil 173. The pressure in the chamber is set at about 0.2 Pa.

By sputtering with the sputtering apparatus 170 set as described above, the cladding layer 52 having the thick film portion 56 as illustrated in FIG. 42 can be formed. Then, the interconnect body portion 51 is formed, whereby the digit line 50 as illustrated in FIG. 7 can be formed.

Figure 43:
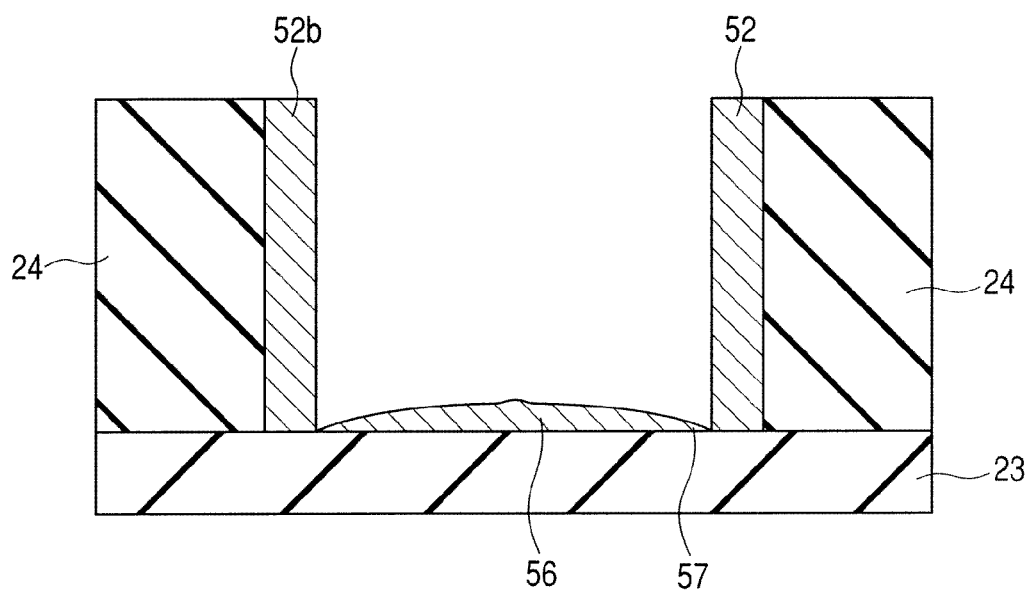
FIG. 43 is a cross-sectional view illustrating another cladding layer 52 and vicinity thereof.

Next, a method of forming the cladding layer 52 having the thin film portion 57 thinned at the end portions thereof as illustrated in FIG. 43 will next be described.

In the sputtering apparatus 170 illustrated in FIG. 23, a DC power of from 2 kW to 5 kW is applied to the target 171. A high-frequency power of 500 W is applied to the stage 172. A high-frequency power of 2000 W and a DC power of from 0 W to 500 W are applied to the coil 173. The pressure in the chamber is set at about 0.2 Pa.

By sputtering with the sputtering apparatus 170 set as described above, the cladding layer 52 as illustrated in FIG. 43 can be formed. Then, the interconnect body portion 51 is formed, whereby the digit line 50 as illustrated in FIG. 11 can be formed.

Figure 44:
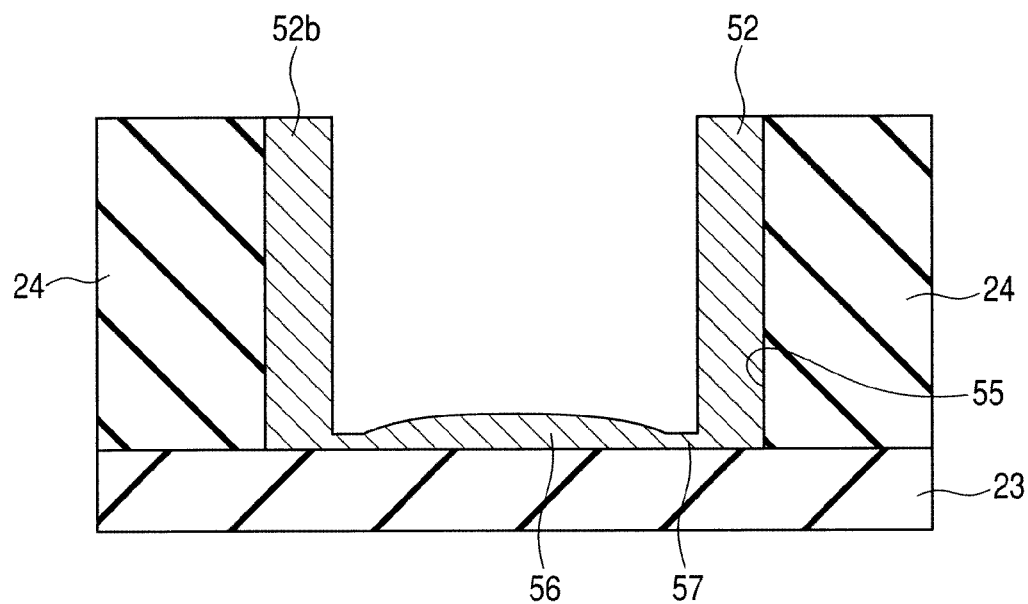
FIG. 44 is a cross-sectional view illustrating a further cladding layer 52 and vicinity thereof.

A method of forming the cladding layer 52 illustrated in FIG. 44 will next be described. The cladding layer 52 illustrated in FIG. 44 is formed by carrying out sputtering twice.

When the first sputtering is performed, a power of from 2 kW to 5 kW is applied to the target 171 in the sputtering apparatus 170 illustrated in FIG. 23. A high frequency power of from 400 W to 500 W is applied to the stage 172. A high-frequency power of 2000 W and a DC power of from 0 W to 500 W are applied to the coil 173. The pressure in the chamber is set at about 0.2 Pa.

Figure 45:
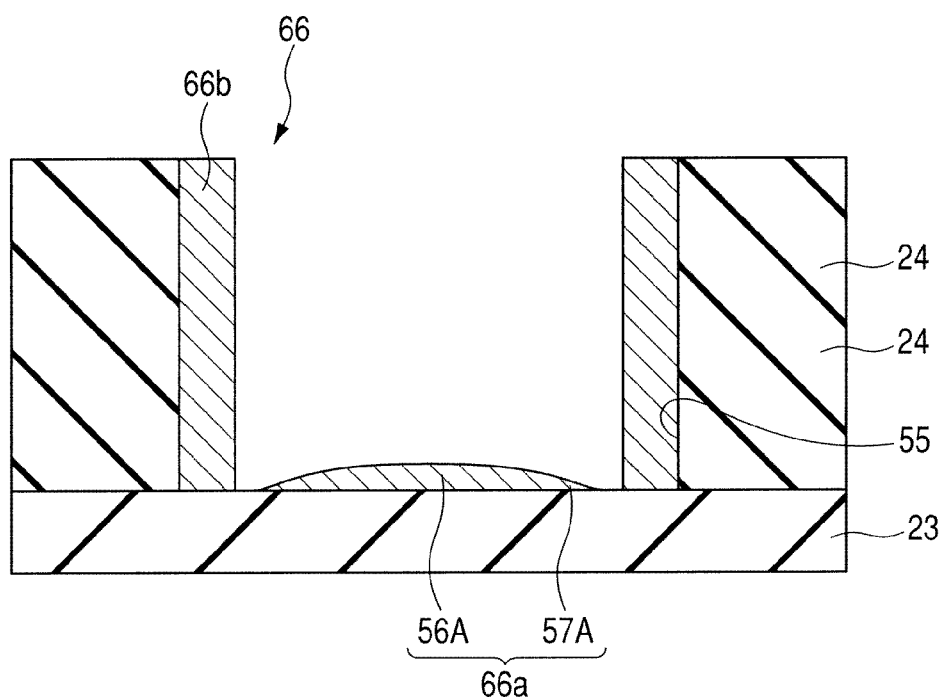
FIG. 45 is a cross-sectional view illustrating a first manufacturing step of manufacturing steps of the clad layer 52 illustrated in FIG. 44.

By sputtering with the sputtering apparatus 170 set as described above, a cladding layer 66 is formed on the inner peripheral surface in the digit line trench 55 as illustrated in FIG. 45.

Figure 46:
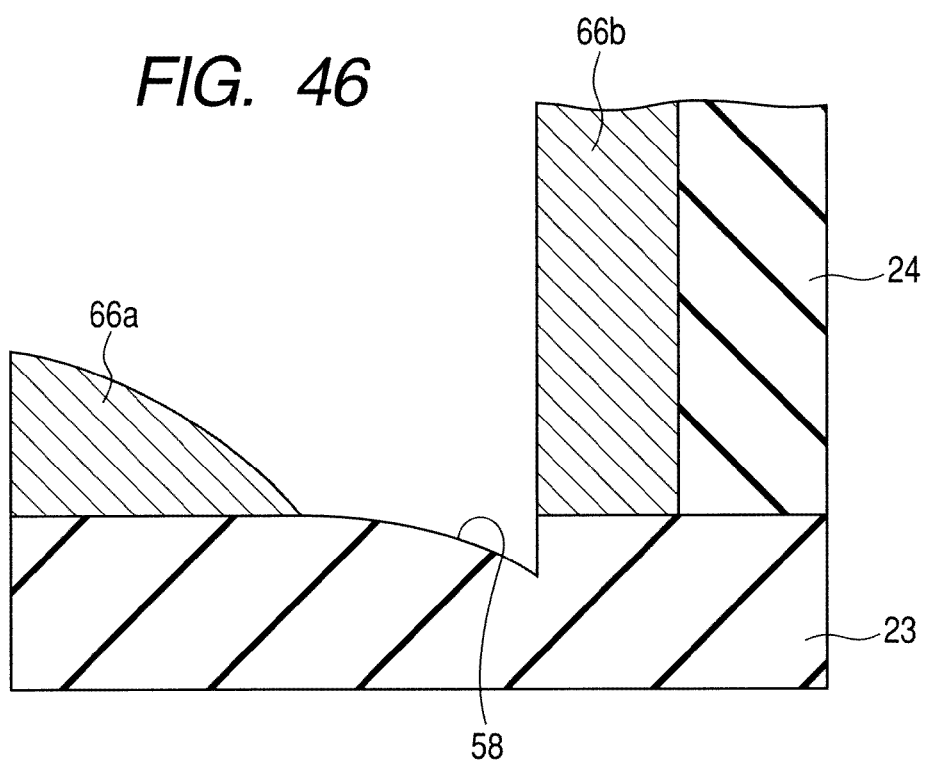
FIG. 46 is an enlarged cross-sectional view of a portion of FIG. 45.

The cladding layer 66 includes a sidewall portion 66b formed on the inner side surface of the digit line trench 55 and a bottom portion 66a. The bottom portion 66a includes a thick film portion 55a and a thin film portion 57a. FIG. 46 is a cross-sectional view illustrating the configuration of the bottom surface of the digit line trench 55 located between the thin film portion 57A and the sidewall portion 66b and vicinity of the bottom surface.

As illustrated in FIG. 46, a portion of the bottom surface of the digit line trench 55 located between the bottom portion 66a and the sidewall portion 66b, a recess 58 is formed. After formation of the cladding layer 66 in such a manner, sputtering is performed again.

In the second sputtering, a DC power of from 2 kW to 5 kW is applied to the target 171 in the sputtering apparatus 170. A high-frequency power of 0 W is applied to the stage 172. A high-frequency power of from 0 W to 2000 W and a DC power of from 0 W to 500 W are applied to the coil 173. The pressure in the chamber is set at 0.2 Pa.

By the second sputtering with the sputtering apparatus 170 set as described above, the cladding layer 52 illustrated in FIG. 44 can be formed.

Figure 47:
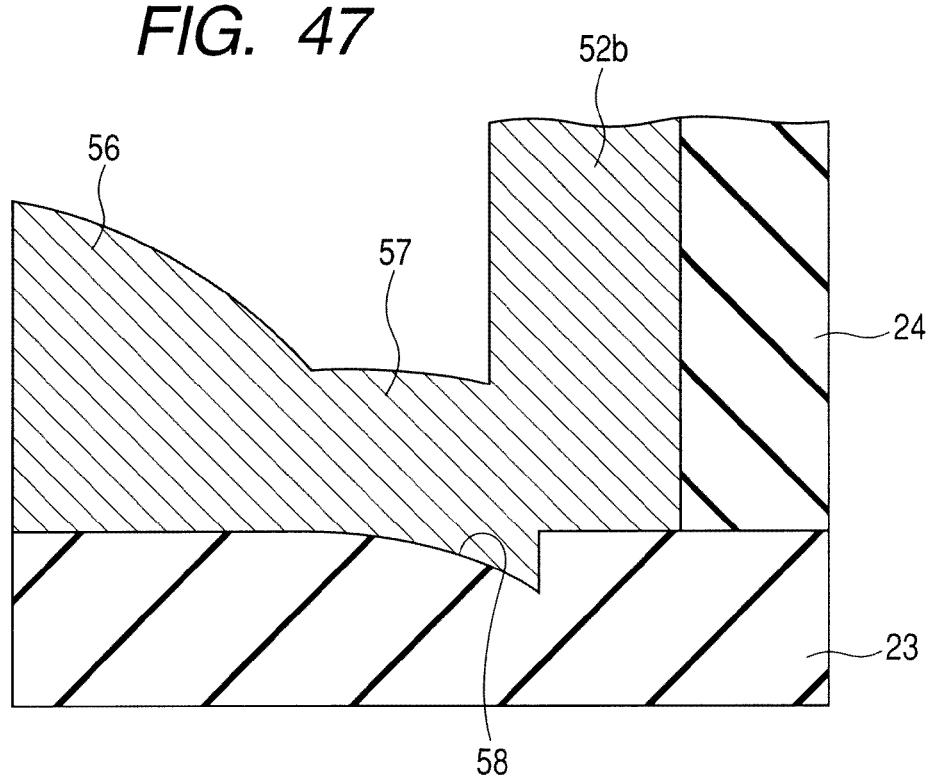
FIG. 47 is a cross-sectional view illustrating a manufacturing step after that illustrated in FIG. 35.

The power to be applied to the stage 172 upon second sputtering is adjusted to be smaller than the power to be applied to the stage 172 upon first sputtering. This reduces directivity of the second sputtering, thereby increasing the thickness of the sidewall portion 66b. Further, as illustrated in FIG. 47, a cladding layer is formed also between the bottom portion 66a and the sidewall portion 66b illustrated in FIG. 46. After formation of the cladding layer 52 illustrated in FIG. 44, an interconnect body portion 51 is formed, whereby the digit line 50 illustrated in FIG. 9 can be formed.

Figure 48:
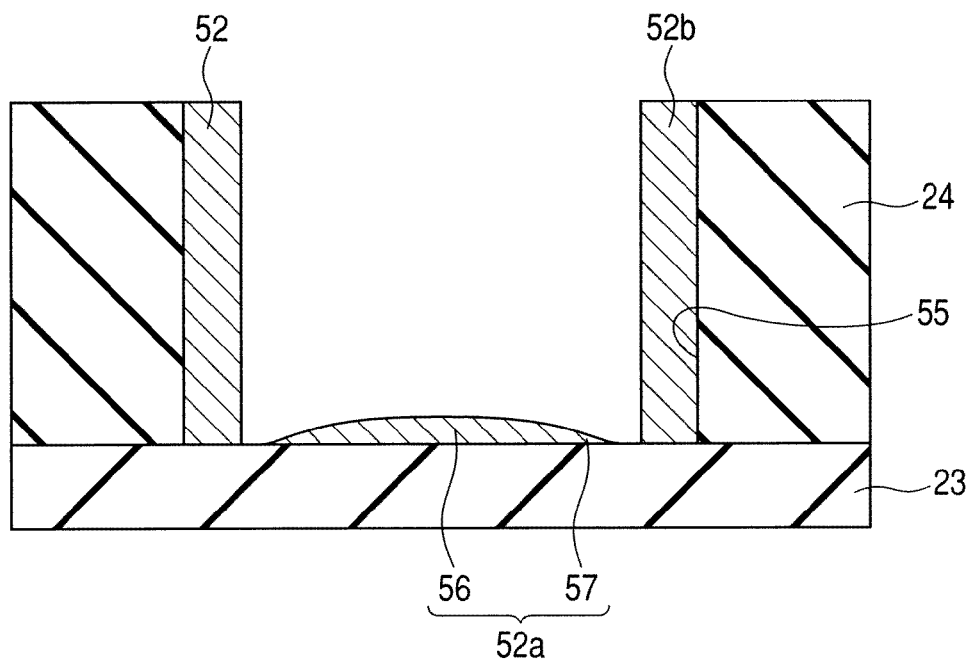
FIG. 48 is a cross-sectional view illustrating a still further cladding layer 52 and vicinity thereof.
Figure 49:
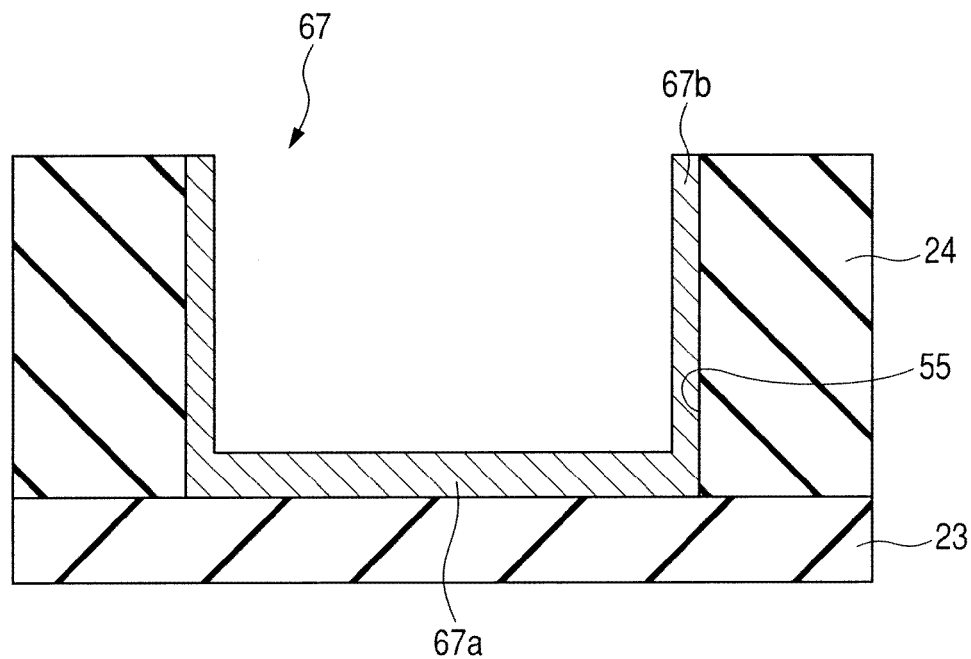
FIG. 49 is a cross-sectional view illustrating a first manufacturing step of manufacturing steps of the cladding layer 52 illustrated in FIG. 48.

A method of forming a cladding layer 52 as illustrated in FIG. 48 will next be described. In order to form the cladding layer 52 as illustrated in FIG. 48, first a cladding layer is formed. Then, the resulting cladding layer is subjected to sputter etching, whereby the cladding layer 52 as illustrated in FIG. 48 is formed.

A DC power of from 2 kW to 5 kW is applied to the target 171 in the sputtering apparatus 170. A high-frequency power of 0 W is applied to the stage 172. A high-frequency power of from 0 W to 2000 W and a DC power of from 0 W to 500 W are applied to the coil 173. The pressure in the chamber is set at about 0.2 Pa.

When the cladding layer is formed using the sputtering apparatus 170 set as described above, a cladding layer 67 as illustrated in FIG. 49 is formed in the digit line trench 55. The bottom portion 67a of the cladding layer 67 has a thickness greater than that of the sidewall portion 67b.

The resulting cladding layer 67 is subjected to sputter etching. Upon this sputter etching, a DC power of from 0 kW to 500 kW is applied to the target 171 in the sputtering apparatus 170. A high-frequency power of from 300 W to 500 W is applied to the stage 172. A high-frequency power of from 1200 W to 2000 W and a DC power of from 0 W to 500 W are applied to the coil 173. The pressure in the chamber is set at about 0.2 Pa.

The cladding layer 52 as illustrated in FIG. 48 can be formed by subjecting the cladding layer 67 to sputter etching using the sputtering apparatus 170 set as described above.

By the above-described sputter etching, the cladding layer located at the bottom portion of the cladding layer 67 attaches to the sidewall portion, leading to an increase in the thickness of the sidewall portion.

Figure 50:
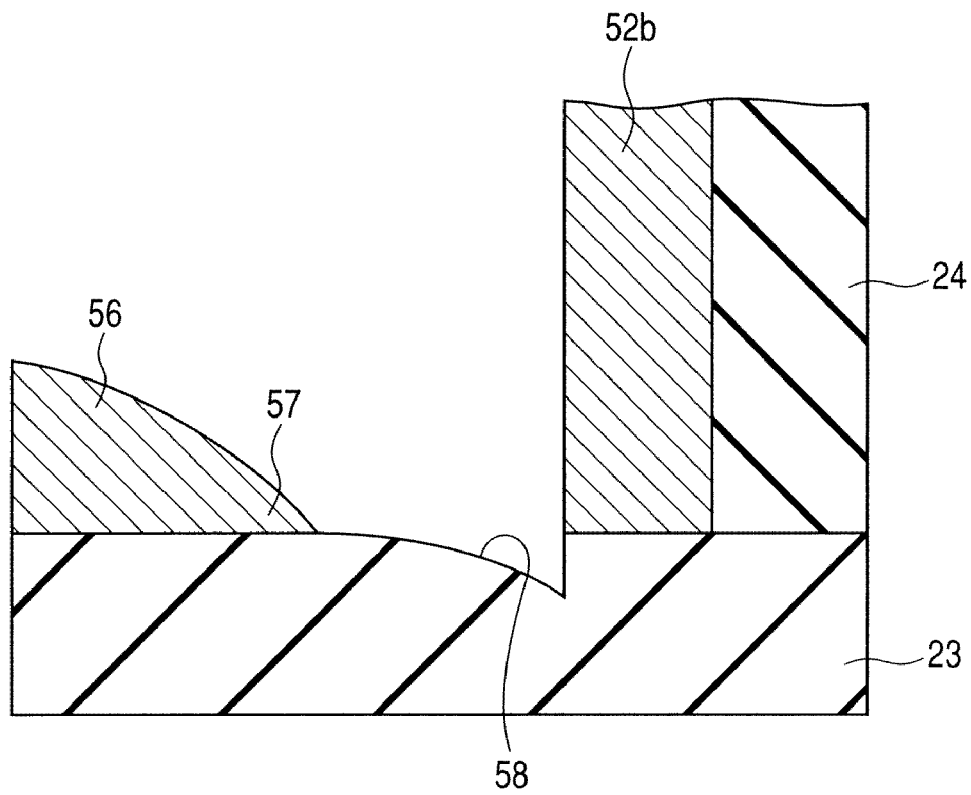
FIG. 50 is a cross-sectional view illustrating a manufacturing step after that illustrating in FIG. 49.

As illustrated in FIG. 50, a recess 58 is formed at a position of the bottom surface of the digit line trench 55 located between the thin film portion 57 and the sidewall portion 52b. An interconnect body portion 51 is formed in the cladding layer 52, whereby a digit line 50 as illustrated in FIG. 12 can be formed.

Figure 51:
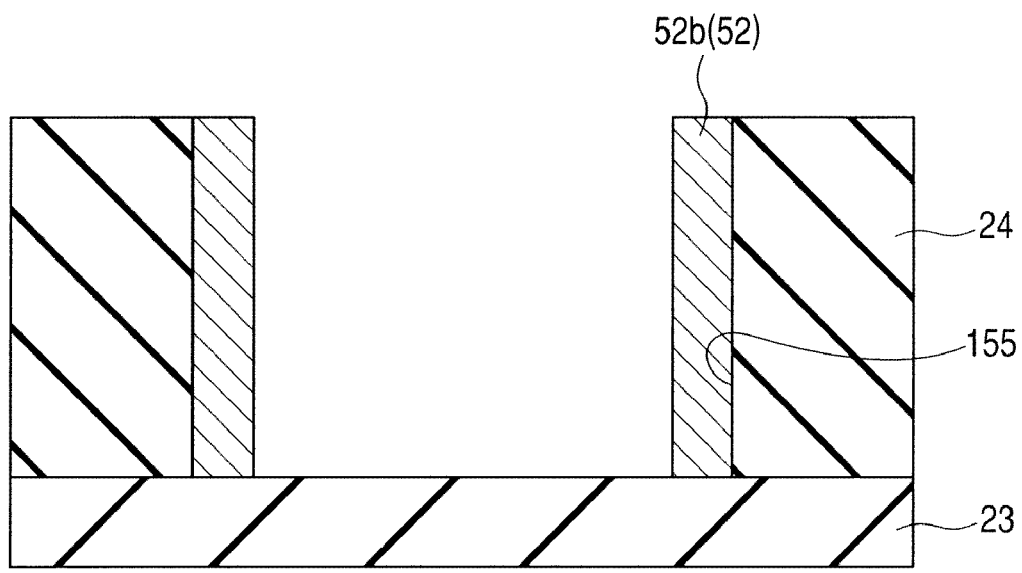
FIG. 51 is a cross-sectional view illustrating a still further cladding layer 52 and vicinity thereof.
Figure 52:
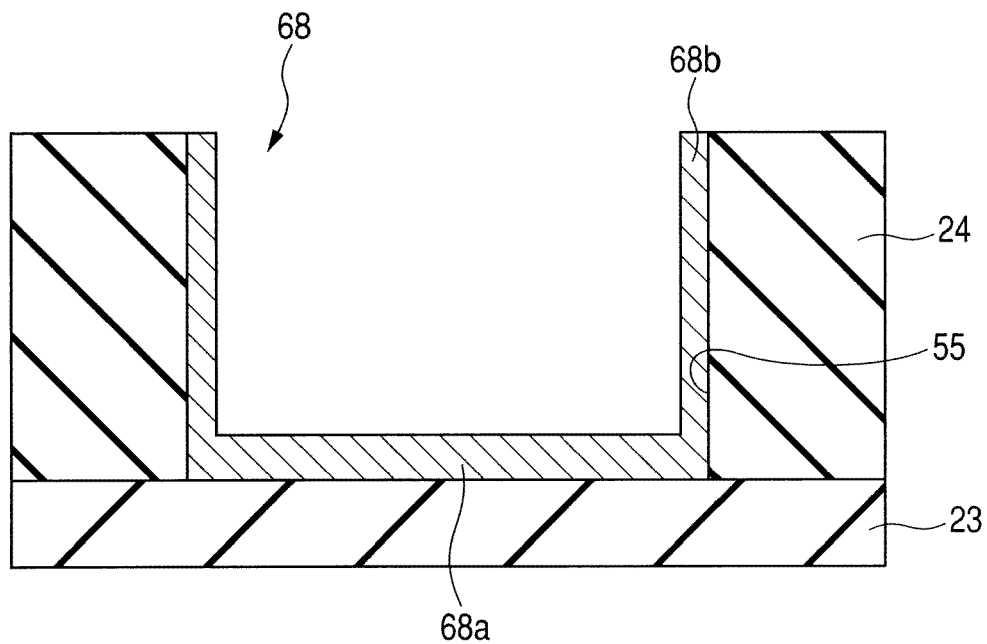
FIG. 52 is a cross-sectional view illustrating a first manufacturing step of manufacturing steps of the cladding layer 52 illustrated in FIG. 51.

A method of forming a cladding layer 52 as illustrated in FIG. 51 will next be described. The cladding layer 52 as illustrated in FIG. 51 can be formed by forming a cladding layer in the digit line trench 55 and then carrying out sputter etching.

When the cladding layer is formed, a DC power of from 2 kW to 5 kW is applied to the target 171 in the sputtering apparatus 170. A high-frequency power of 0 W is applied to the stage 172. A high-frequency power of from 0 W to 2000 W and a DC power of from 0 W to 500 W are applied to the coil 173. The pressure in the chamber is set at about 0.2 Pa. When the cladding layer is formed in the digit line trench 55 by using the sputtering apparatus 170 set as described above, a cladding layer 66 as illustrated in FIG. 52 can be formed.

The cladding layer 68 includes a sidewall portion 68b formed on the inner side surface of the digit line trench 55 and a bottom portion 68a formed on the bottom portion of the digit line trench 55 and the bottom portion 68a has a substantially flat surface.

The cladding layer 68 is then subjected to sputter etching to remove the bottom portion 68a. By the sputter etching, the cladding layer on the bottom portion attaches to the sidewall portion, increasing the thickness of the sidewall portion. Upon sputter etching, a DC power of from 0 W to 500 W is applied to the target 171 in the sputtering apparatus 170. A high-frequency power of from 300 W to 500 W is applied to the stage 172. A high-frequency power of from 1200 W to 2000 W and a DC power of from 0 W to 500 W are applied to the coil 173. The pressure in the chamber is set at about 0.2 Pa.

Embodiments disclosed herein are merely exemplary and the present invention is not limited to or by them. The scope of the invention is indicated by Claims not by the scope described above and the invention is intended to cover all the modifications within the spirit and scope equivalent to Claims.

The present invention can be applied to a semiconductor device and a manufacturing method thereof and it is particularly suited for a semiconductor device equipped with a magnetoresistive element and a manufacturing method thereof.

What is claimed is:

1. A semiconductor device comprising:
   a semiconductor substrate;
   a switching element formed over a main surface of the semiconductor substrate;
   an interlayer insulating film covering therewith the switching element;
   a conductive film formed over the interlayer insulating film;
   a coupling interconnect for coupling the conductive film to the switching element;
   a magnetic storage element including a magnetization free layer whose magnetization direction is made variable, and formed over the conductive film;
   a first interconnect located below the magnetic storage element, extending in a first direction, and capable of changing the magnetization state of the magnetization free layer by a magnetic field generated; and
   a second interconnect located above the magnetic storage element, extending in a second direction, and capable of changing the magnetization state of the magnetization free layer by a magnetic field generated,
   wherein the magnetic storage element is provided over the upper surface of the conductive film distant from the coupled position of the conductive film and the coupling interconnect,
   wherein the first interconnect has a first interconnect body and a first magnetic field shielding layer which is provided so as to cover the bottom surface and side surfaces of the first interconnect body and is opened upward,
   wherein the first magnetic field shielding layer has a first sidewall portion covering therewith the side surfaces of the first interconnect body and a first bottom wall portion covering therewith the bottom surface of the first interconnect body, and
   wherein the thickness of the first sidewall portion is greater than that of the first bottom wall portion.

2. The semiconductor device according to claim 1, wherein the first bottom wall portion includes a thick film portion and a thin film portion thinner than the thick film portion.

3. The semiconductor device according to claim 2, wherein the thick film portion is formed at the center in the width direction of the first bottom wall portion.

4. The semiconductor device according to claim 2, wherein a portion of the first bottom wall portion enters the interlayer insulating film.

5. The semiconductor device according to claim 1, wherein the first bottom wall portion and the first sidewall portion have therebetween a space portion.

6. The semiconductor device according to claim 1,
   wherein the second interconnect includes a second interconnect body and a second magnetic field shielding layer which is provided so as to cover therewith the upper surface and the side surface of the second interconnect body and is opened downward,
   wherein the second magnetic field shielding layer includes a second sidewall portion covering therewith the side surface of the second interconnect body and an upper wall portion covering therewith the upper surface of the second interconnect body, and
   wherein the thickness of the second side wall portion is greater than the thickness of the upper wall portion.

7. The semiconductor device according to claim 1,
   wherein the interlayer insulating film is located below the conductive film and includes a flat insulating film having a flat upper surface,
   wherein the coupling interconnect includes two or more unit coupling portions stacked one after another and at the same time includes an upper-level unit coupling portion located below the flat insulating film,
   wherein the upper-level unit coupling portion includes a coupling portion body and a third magnetic field shielding layer covering therewith the side surface and the bottom surface of the coupling portion body,
   wherein the third magnetic field shielding layer includes a third sidewall portion covering the side surface of the coupling portion body and a second bottom wall portion covering therewith the bottom surface of the coupling portion body, and
   wherein the thickness of the third sidewall portion is greater than the thickness of the second bottom wall portion.

8. A semiconductor device comprising:
   a semiconductor substrate;
   a switching element formed over a main surface of the semiconductor substrate;
   an interlayer insulating film covering therewith the switching element;
   a conductive film formed over the interlayer insulating film;
   a coupling interconnect for coupling the conductive film to the switching element;
   a magnetic storage element including a magnetization free layer whose magnetization direction is made variable and formed over the conductive film;
   a first interconnect located below the magnetic storage element, extending in a first direction, and capable of changing the magnetization state of the magnetization free layer by a magnetic field generated; and
   a second interconnect located above the magnetic storage element, extending in a second direction, and capable of changing the magnetization state of the magnetization free layer by a magnetic field generated,
   wherein the magnetic storage element is provided at a position distant from the coupled position of the conductive film and the coupling interconnect, wherein the first interconnect has a first interconnect body and a first magnetic field shielding layer covering therewith the side surface of the first interconnect body, and wherein the first magnetic field shielding layer is opened upward and downward.

9. A manufacturing method of a semiconductor device comprising the steps of:

preparing a semiconductor substrate having a main surface, forming a switching element over the main surface of the semiconductor substrate;

forming an insulating film so as to cover therewith the switching element;

forming a coupling interconnect coupled to the switching element and reaching the upper surface of the insulating film;

forming a first interconnect trench in the insulating film;

forming a first magnetic field shielding layer over the inner peripheral surface of the first interconnect trench;

forming a first interconnect body over the first magnetic field shielding layer;

forming a flat insulating film having a flat upper surface over the first interconnect body and the insulating film;

forming a flat-plate like conductive film located over the flat insulating film and coupled to the coupling interconnect; and forming a magnetic storage element over the conductive film, wherein the first magnetic field shielding layer includes a first bottom wall portion covering therewith the bottom surface of the first interconnect trench and a first sidewall portion covering therewith the side surface of the first interconnect trench, and wherein the thickness of the first sidewall portion of the first magnetic field shielding layer is greater than the thickness of the first bottom wall portion.

10. The manufacturing method of a semiconductor device according to claim 9, further comprising a step of forming, in the first interconnect trench, a barrier metal extending along the side surface and the bottom surface of the first interconnect trench, wherein a side coverage ratio of the first magnetic field shielding layer is greater than a side coverage ratio of the barrier metal.

11. The manufacturing method of a semiconductor device according to claim 9, further comprising the steps of:

forming an upper insulating film so as to cover the magnetic storage element therewith; and forming, in the upper insulating film, a second interconnect coupled to the magnetic storage element, wherein the step of forming a second interconnect comprises the sub-steps of:

forming a second interconnect trench in the upper insulating film;

forming a second sidewall portion of a second magnetic field shielding layer over the inner side surface of the second interconnect trench;

forming a second interconnect body in the second interconnect trench; and forming an upper wall portion of the second magnetic field shielding layer thinner than the second sidewall portion over the second interconnect body.

12. The manufacturing method of a semiconductor device according to claim 9, wherein the step of forming a first interconnect trench in the insulating film comprises forming a coupling interconnect trench in the insulating film, wherein the step of forming a first magnetic field shielding layer comprises forming a third magnetic field shielding layer extending along the inner peripheral surface of the coupling interconnect trench, and wherein the step of forming a first interconnect body comprises forming a coupling portion body over the third magnetic field shielding layer.

13. A manufacturing method of a semiconductor device, comprising the steps of:

preparing a semiconductor substrate having a main surface;

forming a switching element over the main surface of the semiconductor substrate;

forming an insulating film so as to cover the switching element therewith;

forming a first interconnect trench in the insulating film;

forming a magnetic field shielding material film over the inner peripheral surface of the first interconnect trench;

removing the magnetic field shielding material film from the bottom portion of the first interconnect trench;

forming a first interconnect body over the magnetic field shielding material film;

forming a coupling interconnect coupled to the switching element and reaching the upper surface of the insulating film;

forming a flat insulating film having a flat upper surface over the first interconnect body and the insulating film;

forming a flat-plate like conductive film located over the flat insulating film and coupled to the coupling interconnect; and forming a magnetic storage element over the conductive film.

\* \* \* \* \*